(12) United States Patent
Miura et al.

(10) Patent No.: US 7,177,179 B2
(45) Date of Patent: Feb. 13, 2007

(54) MAGNETIC MEMORY, AND ITS OPERATING METHOD

(75) Inventors: Sadahiko Miura, Tokyo (JP);
Tadahiko Sugibayashi, Tokyo (JP);
Hideaki Numata, Tokyo (JP);
Kiyotaka Tsuji, Tokyo (JP)

(73) Assignee: NEC Corporation, Tokyo (JP)

( * ) Notice: Subject to any disclaimer, the term of this patent is extended or adjusted under 35 U.S.C. 154(b) by 157 days.

(21) Appl. No.: 10/512,545

(22) PCT Filed: Apr. 21, 2003

(86) PCT No.: PCT/JP03/05030

§ 371 (c)(1),
(2), (4) Date: Oct. 25, 2004

(87) PCT Pub. No.: WO03/092076

PCT Pub. Date: Jun. 11, 2003

(65) Prior Publication Data
US 2006/0056250 A1   Mar. 16, 2006

(30) Foreign Application Priority Data
Apr. 23, 2002   (JP)   .............................. 2002-121082

(51) Int. Cl.
*G11C 11/14*   (2006.01)
(52) U.S. Cl. ...................................... 365/171; 365/158
(58) Field of Classification Search ................ 365/171, 365/158, 189.01
See application file for complete search history.

(56) References Cited
U.S. PATENT DOCUMENTS
5,640,343 A   6/1997   Gallagher et al.
6,165,803 A   12/2000  Chen et al.
6,542,398 B2 *  4/2003  Kang et al. .................... 365/97
6,614,682 B2 *  9/2003  Hirai .......................... 365/173

FOREIGN PATENT DOCUMENTS

| EP | 1109170 | 6/2001 |
|---|---|---|
| JP | 2000-353791 | 12/2000 |
| JP | 2001-156358 | 6/2001 |
| JP | 2001-195878 | 7/2001 |
| JP | 2001-284679 | 10/2001 |
| JP | 2001-357666 | 12/2001 |
| JP | 2003-086775 | 3/2003 |
| JP | 2003-197876 | 7/2003 |

* cited by examiner

*Primary Examiner*—Vu A. Le
(74) *Attorney, Agent, or Firm*—Young & Thompson

(57) ABSTRACT

A technology for eliminating the defects in a tunnel insulation film of magnetic tunnel junction and for suppressing generation of a defective bit in an MRAM using magnetic tunnel junction in a memory. The magnetic memory includes a substrate, an interlayer insulation film covering the upper surface side of the substrate, memory cells, and plugs penetrating the interlayer insulation film. The memory cell includes a first magnetic layer formed on the upper surface side of the interlayer insulation film, a tunnel insulation layer formed on the first magnetic layer, and a second magnetic layer formed on the tunnel insulation layer. The plug is connected electrically with the first magnetic layer. The tunnel current passing part of the tunnel insulation layer located between the first and second magnetic layers is arranged, at least partially, so as not to overlap the plug in the direction perpendicular to the surface of the substrate.

17 Claims, 24 Drawing Sheets

MAGNETIC MEMORY, AND ITS OPERATING METHOD

This application is a 371 of PCT/JP03/05030 filed on Apr. 21, 2003.

TECHNICAL FIELD

The present invention relates to an MRAM (Magnetic Random Access Memory: magnetic random access memory). In particular, the present invention relates to an MRAM which uses a magnetic tunnel junction (Magnetic Tunnel Junction: MTJ) expressing TMR (Tunneling MagnetoResistance) effect as a memory cell for storing data.

BACKGROUND ART

An MRAM is one of promising non-volatile memories, in which a digital data is stored as an orientation of a spontaneous magnetization in a ferromagnetic material. The orientation of the spontaneous magnetization is retained, unless an external magnetic field with a certain strength is applied. Therefore, the digital data stored as the orientation of the spontaneous magnetization is non-volatily stored for a long period.

According to the MRAM, magneto-resistance effects such as an AMR (Anisotropic MagnetoResistance) effect, GMR (Giant MagnetoResistance) effect and the TMR effect are utilized for reading. The reading by using the GMR effect and the reading by using the TMR effect are disclosed in Japanese Laid Open Patent Application (P2001-195878A).

The utilization of the TMR effect of these magnetoresistance effects for the reading operation is preferable in that the memory cell area of a magnetic random access memory can be made small. The U.S. Pat. No. 5,640,343 discloses an MRAM which carries out the reading operation by using the TMR effect. As shown in FIG. 1, the MRAM in the public domain includes bit lines 201, word lines 202 and memory cells 203 respective of which are provided at regions where the bit lines 201 and word lines 202 overlap.

FIG. 2 is a cross sectional view of the MRAM in the public domain. The bit line 201 is formed on a substrate 204. The bit line 201 is covered by a first interlayer insulating film 205. An aperture is formed in the first interlayer insulating film 205, and the aperture is filled in with a diode 206 and a tungsten via 207.

On the tungsten via 207, a pinned ferromagnetic layer 208, a tunnel insulating layer 209, and a free ferromagnetic layer 210 constituting the memory cell 203 are formed in order. The pinned ferromagnetic layer 208, the tunnel insulating layer 209, and the free ferromagnetic layer 210 provide the magnetic tunnel junction expressing the TMR effect. More specifically, each of the pinned ferromagnetic layer 208 and the free ferromagnetic layer 210 is made of ferromagnetic material. The pinned ferromagnetic layer 208 is formed such that the orientation of its spontaneous magnetization is along a predetermined direction, and the free ferromagnetic layer 210 is formed such that the orientation of its spontaneous magnetization is reversible. The orientation of the spontaneous magnetization in the free ferromagnetic layer 210 is allowed to be either parallel or anti-parallel to the orientation of the spontaneous magnetization in the pinned ferromagnetic layer 208. The orientations of the spontaneous magnetization in the free ferromagnetic layer 210 are associated with the data "1" and the data "0". The tunnel insulating layer 209 is made extremely thin for the tunnel current to flow, and its thickness is typically 1 to 3 nm.

The memory cell 203 is covered by a second interlayer insulating film 211. The above-mentioned word line 202 penetrates the second interlayer insulating film 211 to be connected to the free ferromagnetic layer 210, which is not shown in FIG. 2.

FIG. 3 shows a memory cell array in which the memory cells 203 are placed and a peripheral circuit for accessing the memory cells 203. As mentioned above, the memory cells 203 are placed at the locations where the bit lines 201 and the word lines 202 cross, and the memory cells 203 electrically bridge the bit lines 201 and the word lines 202. Row selector transistors 212, 213 are connected to both ends of the bit line 201, and column selector transistors 214, 215 are connected to both ends of the word line 202.

In reference to FIG. 3, writing of data to the memory cell 203 is carried out as follows. In the case when a data is written to a memory cell 203a of the memory cells 203, a bit line 201a and a word line 202a connecting with the memory cell 203a are first selected. Row selector transistors 212a, 213a connected with the selected bit line 201a are activated. Further, column selector transistors 214a, 215a connected with the selected word line 202a are activated. A write current $I_1$ flows in the word line 202a through the activated column selector transistors 214a, 215a. Further, a write current $I_2$ flows in the bit line 201a through the activated row selector transistors 212a, 213a. Due to a combined magnetic field generated by the write currents $I_1$ and $I_2$, the free ferromagnetic layer 210 in the memory cell 203 is reversed to a desired direction and hence the data is written to the memory cell 203.

Considerably large write currents $I_1$, $I_2$ are necessary for reversing the spontaneous magnetization. The write currents $I_1$, $I_2$ are typically in a range from a few mA to a few tens of mA. Therefore, MOS transistors having large gate width are used as the row selector transistors 212, 213 and the column selector transistors 214, 215. The usage of the MOS transistors having the large gate width causes an increase of the area of the peripheral circuit of the MRAM.

On the other hand, reading of data from a memory cell 203 is carried out by detecting a read current $I_r$ flowing through the memory cell 203 at the time when a voltage is applied between the bit line 201 and the word line 202. When the voltage is applied between the bit line 201 and the word line 202, the read current $I_r$ flows through the tunnel insulating layer 209 of the memory cell 203 due to the tunneling phenomenon. Due to the TMR effect, the intensity of the read current $I_r$ varies according to the orientation of the spontaneous magnetization in the free ferromagnetic layer 210. The orientation of the spontaneous magnetization in the free ferromagnetic layer 210 is detected based on the intensity of the read current $I_r$, and hence the data written to the memory cell 203 is identified.

One of important things in ensuring reliability of an MRAM is to prevent heat deterioration and etching damage of the memory cell 203 in the manufacturing process. Japanese Laid Open Patent Application (P2000-353791A) and the related U.S. Pat. No. 6,165,803 disclose that magnetic random access memory elements are defined by transforming portions of a magnetic element blanket layer into an insulative material in order to prevent the heat deterioration and the etching damage of the magnetic random access memory elements.

Furthermore, it is important to form the tunnel insulating layer 209 having substantially no defects for ensuring the reliability of such an MRAM. When there exist defects such as pin holes in the tunnel insulating layer 209, the bit line 201 and the word line 202 short or the performance deteriorates locally, which causes the malfunction of the MRAM.

However, the above-mentioned MRAM has a structure with which defects tend to be generated in the tunnel insulating layer 209. In the MRAM mentioned above, the pinned ferromagnetic layer 208 is formed on the tungsten via 207, and the tunnel insulating layer 209 is formed on the pinned ferromagnetic layer 208 as shown in FIG. 2. The tungsten via 207 is generally formed after a tungsten film is deposited all over the upper side of the substrate, and formed by using etch back or CMP (Chemical Mechanical Polishing) to leave the tungsten film only in the aperture provided for the first interlayer insulating film 205. In this case, the surface of the tungsten via 207 is wasted due to the etch back or the CMP. Furthermore, when the aperture provided for the first interlayer insulating film 205 is not completely filled in with the tungsten film, a concavity can be formed at the center of the tungsten via 207. Thus, it is not easy to thoroughly planarize the surface of the tungsten via 207 according to the current technology. The concavity and convexity on the surface of the tungsten via 207 cause concavity and convexity in the pinned ferromagnetic layer 208, which further cause concavity and convexity in the tunnel insulating layer 209 formed thereon. The concavity and convexity in the tunnel insulating layer 209 cause defects such as pin holes and hence cause the malfunction of the memory cell 203.

There is the necessity of eliminating defects of the tunnel insulating film as possible and preventing occurrence of failure bits.

DISCLOSURE OF INVENTION

An object of the present invention is to provide a technology for eliminating defects of a tunnel insulating film in a magnetic tunnel junction as possible and for suppressing occurrence of failure bits in an MRAM which uses the magnetic tunnel junction as a memory cell.

Another object of the present invention is to provide a technology for eliminating defects of a tunnel insulating film in a magnetic tunnel junction as possible and for reducing the area of a memory cell of an MRAM.

Still another object of the present invention is to provide a technology for eliminating defects of a tunnel insulating film in a magnetic tunnel junction as possible and for reducing the area of a peripheral circuit of an MRAM.

Still another object of the present invention is to provide a technology for eliminating defects of a tunnel insulating film in a magnetic tunnel junction as possible and for highly integrating an MRAM.

In an aspect of the present invention, a magnetic random access memory has a substrate, an interlayer insulating film which covers the substrate, a memory cell and a plug which penetrates the interlayer insulating film. The memory cell includes a first magnetic layer formed above the interlayer insulating film, a tunnel insulating layer formed on the first magnetic layer and a second magnetic layer formed on the tunnel insulating layer. The plug is electrically connected to the first magnetic layer. At least a part of a tunnel current passage section of the tunnel insulating layer which is located between the first magnetic layer and the second magnetic layer is arranged so as not to overlap with the plug in a vertical direction which is vertical to a surface of the substrate.

According to the current process technology, the occurrence of concavities and convexities on a surface of the plug to some extent is inevitable. Since at least a part of the tunnel current passage section is formed not to overlap with the plug on whose surface the concavities and convexities appear, smoothness of the section of the tunnel current passage section without overlapping is improved and defects generated in the tunnel current passage section are reduced.

In order to further reduce the defects in the tunnel current passage section, it is preferable that the whole of the tunnel current passage section is arranged not to overlap with the plug.

In order to further reduce the defects in the tunnel current passage section, it is preferable that a surface of the interlayer insulating film is planarized to be flat.

Preferably, the magnetic random access memory further has a lower electrode which is provided between the interlayer insulating film and the first magnetic layer and has a lower resistance than that of the first magnetic layer. The first magnetic layer is electrically connected to the plug through the lower electrode.

The structure mentioned above is effective when the plug includes a metal section made of a metal, in particular, includes a section made of tungsten. In the plug made of a metal, particularly tungsten, the concavities and convexities tend to appear on its surface. The structure mentioned above is particularly effective in the case when the concavities and convexities tend to appear on the surface of the plug.

In the magnetic random access memory, it is preferable that a tunnel current flows between a plurality of the second magnetic layers and one first magnetic layer of the first magnetic layers. Such a structure makes it possible to distribute the second magnetic layers more densely and to highly-integrate the magnetic random access memory.

In order to distribute the second magnetic layers more densely, it is preferable that the number of the plugs connected with the one first magnetic layer is smaller than the number of the second magnetic layers.

In another aspect of the present invention, a magnetic random access memory according to the present invention has a substrate, a first interconnection formed on the substrate and extending in a predetermined first direction, an interlayer insulating film covering the first interconnection and a memory cell formed above the interlayer insulating film. The memory cell includes a first magnetic layer having a pinned spontaneous magnetization which is fixed, a second magnetic layer having a free spontaneous magnetization which is reversible according to a stored data and a tunnel insulating layer provided between the first magnetic layer and the second magnetic layer. The magnetic random access memory further has a first current applying section which supplies to the first interconnection a first current for generating a first magnetic filed applied to the memory cell when rewriting the stored data, and a voltage applying section which applies a voltage between the first magnetic layer and the second magnetic layer when reading the stored data. The first interconnection is electrically isolated from the memory cell.

Such a configuration eliminates the need to connect the memory cell and the first interconnection by using the plug and makes it easy to prevent the occurrence of the defects in the tunnel insulating film due to the concavities and convexities on the surface of the plug. Moreover, the elimination of the need to connect the memory cell and the first interconnection with the plug is effective in highly-integrating the magnetic random access memory. Furthermore, although a large first current is necessary for reversing the spontaneous magnetization in the second magnetic layer, such a configuration makes it unnecessary to supply the large first current to the voltage applying section, and makes it possible to form the voltage applying section with transistors having smaller areas.

In the case when one of the first magnetic layer and the second magnetic layer is formed to extend in the first direction, and the magnetic random access memory further has a plug which electrically connects the voltage applying section with the memory cell and penetrates the interlayer insulating film to be connected to the one layer, it is preferable that at least a part of a tunnel current passage section of the tunnel insulating layer which is located between the first magnetic layer and the second magnetic layer does not overlap with the plug in a vertical direction which is vertical to a surface of the substrate.

Preferably, the magnetic random access memory further has a second interconnection which is electrically connected to one of the first magnetic layer and the second magnetic layer and is formed to extend in a second direction which is substantially perpendicular to the first interconnection, a third interconnection which is formed to extend in the second direction and is electrically isolated from the second interconnection, and a second current applying section which supplies to the third interconnection a second current for generating a second magnetic filed applied to the second magnetic layer when rewriting the stored data. The voltage applying section preferably applies the voltage between the first magnetic layer and the second magnetic layer through the second interconnection. A large second current is necessary for reversing the spontaneous magnetization in the second magnetic layer. Such a configuration makes it unnecessary to supply the large second current to the voltage applying section, and makes it possible to form the voltage applying section with transistors having smaller areas.

In still another aspect of the present invention, the magnetic random access memory according to the present invention has a substrate and a memory cell formed above the substrate. The memory cell includes a first magnetic layer having a pinned spontaneous magnetization which is fixed, a second magnetic layer having a free spontaneous magnetization which is reversible according to a stored data and a tunnel insulating layer provided between the first magnetic layer and the second magnetic layer. The magnetic random access memory further has a second interconnection which is electrically connected to one of the first magnetic layer and the second magnetic layer and is formed to extend in a predetermined second direction, a third interconnection which is formed to extend in the second direction and is electrically isolated from the second interconnection, a second current applying section which supplies to the third interconnection a second current for generating a second magnetic filed applied to the second magnetic layer when rewriting the stored data, and a voltage applying section which applies a voltage between the first magnetic layer and the second magnetic layer through the second interconnection when reading the stored data.

In order to highly-integrate the memory, it is preferable that the memory cells are arranged in a direction vertical to a surface of the substrate.

In still another aspect of the present invention, a method of operating a magnetic random access memory, which includes: a first magnetic layer having a pinned spontaneous magnetization which is fixed; a second magnetic layer having a free spontaneous magnetization which is reversible according to a stored data; a tunnel insulating layer provided between the first magnetic layer and the second magnetic layer; and a first interconnection electrically isolated from both of the first magnetic layer and the second magnetic layer, has the steps of: generating a magnetic field by supplying a current to the first interconnection, and reversing the free spontaneous magnetization by the magnetic field; applying a voltage between the first magnetic layer and the second magnetic layer without the first interconnection; and detecting a tunnel current which flows through the tunnel insulating layer due to the voltage, and determining the stored data based on the tunnel current.

In still another aspect of the present invention, a method of operating a magnetic random access memory, which includes: a first magnetic layer having a pinned spontaneous magnetization which is fixed; a second magnetic layer having a free spontaneous magnetization which is reversible according to a stored data; a tunnel insulating layer provided between the first magnetic layer and the second magnetic layer; a first interconnection electrically isolated from both of the first magnetic layer and the second magnetic layer; and a second interconnection which is electrically isolated from both of the first magnetic layer and the second magnetic layer and is formed to extend in a direction substantially perpendicular to the direction in which the first interconnection extends, has the steps of: generating a magnetic field by supplying a first current to the first interconnection and a second current to the second interconnection, and reversing the free spontaneous magnetization by the magnetic field; applying a voltage between the first magnetic layer and the second magnetic layer without the first interconnection and the second interconnection; and detecting a tunnel current which flows through the tunnel insulating layer due to the voltage, and determining the stored data based on the tunnel current.

The present invention eliminates defects of the tunnel insulating film in the magnetic tunnel junction as possible, and effectively suppresses the occurrence of failure bits in the MRAM which uses the magnetic tunnel junction as the memory cell.

Also, the present invention eliminates defects of the tunnel insulating film in the magnetic tunnel junction as possible, and effectively reduces the area of the memory cell of the MRAM.

Also, the present invention eliminates defects of the tunnel insulating film in the magnetic tunnel junction as possible, and effectively reduces the area of the peripheral circuit of the MRAM.

Also, the present invention eliminates defects of the tunnel insulating film in the magnetic tunnel junction as possible, and highly integrates the MRAM.

BEST MODE FOR CARRYING OUT THE INVENTION

First Embodiment

Figure 4:
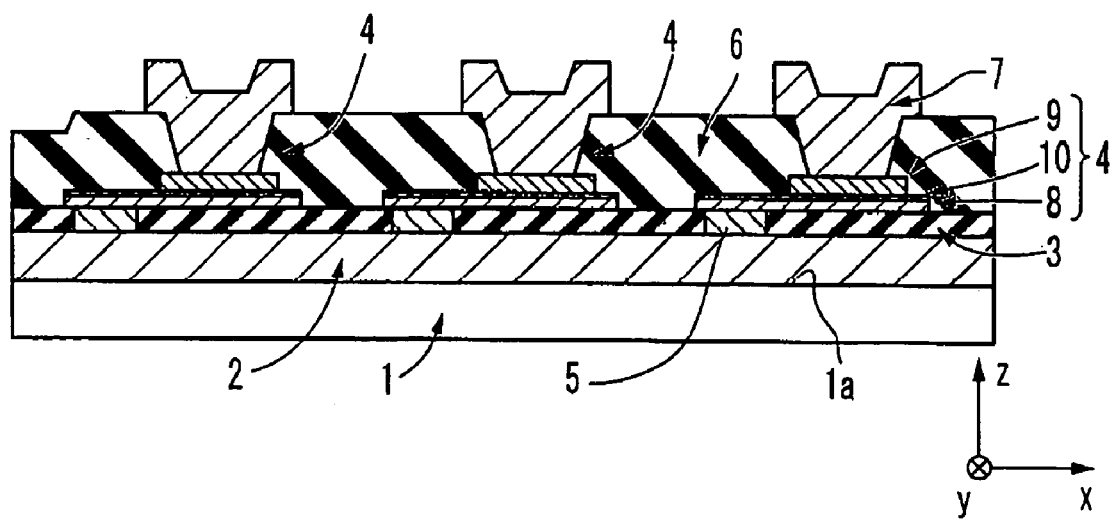
FIG. 4 is a cross sectional view showing a first embodiment of an MRAM according to the present invention.
Figure 5:
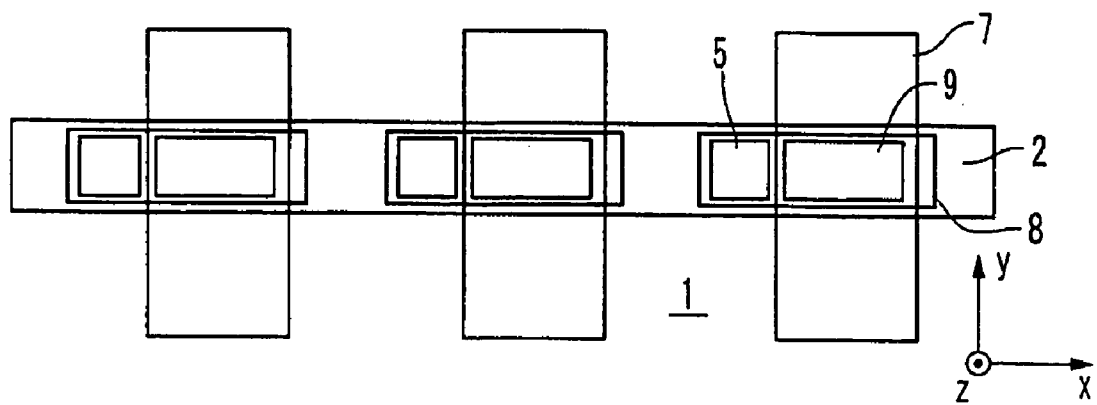
FIG. 5 is a plan view showing the first embodiment of the MRAM according to the present invention.

FIG. 4 shows a first embodiment of an MRAM according to the present invention. In the MRAM, a substrate 1 in which a transistor (not shown) is formed is provided together with a bit line 2. The bit line 2 is formed on the substrate 1. As shown in FIG. 5, the bit line 2 is formed to extend in the x-axis direction. As shown in FIG. 4, the bit line 2 is covered by an interlayer insulating film 3 made of silicon dioxide. The surface of the interlayer insulating film 3 is planarized and made into smooth by the CMP so as to be substantially parallel to the surface 1a of the substrate 1. It is easy to made the surface of the silicon dioxide film into smooth by the CMP. A memory cell 4 is formed on the interlayer insulating film 3.

Figure 6:
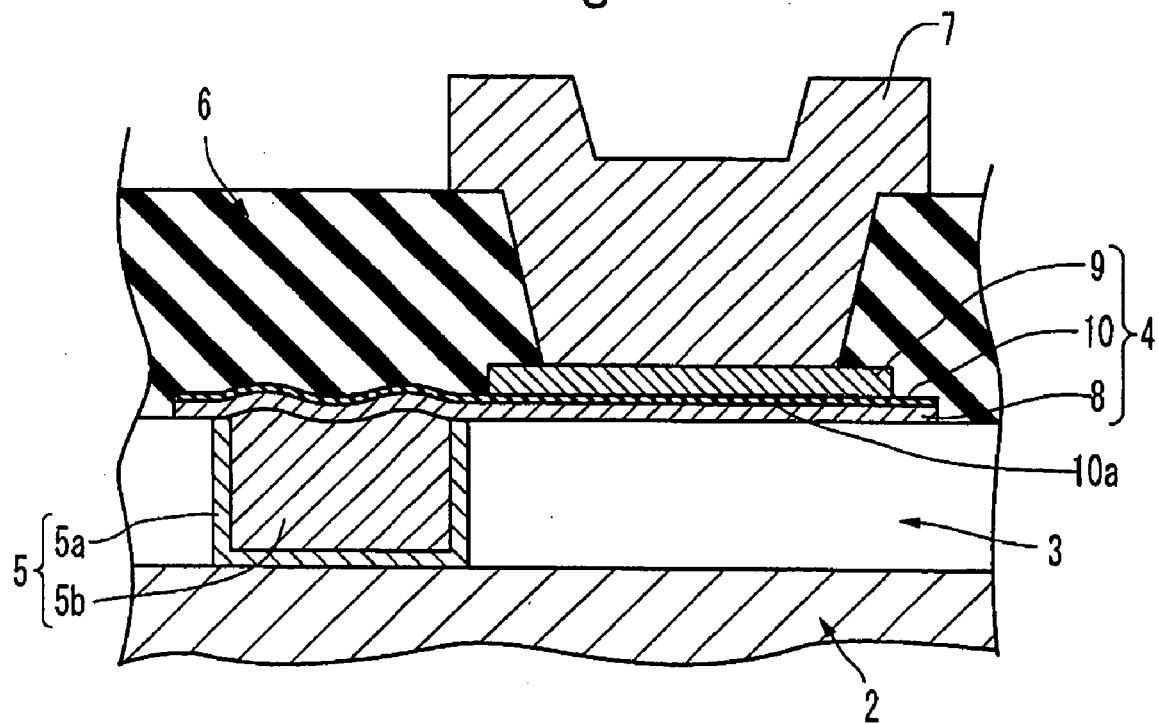
FIG. 6 is a magnified cross sectional view showing the first embodiment of the MRAM according to the present invention.

The memory cell 4 is electrically connected to the bit line 2 through a tungsten plug 5 penetrating the interlayer insulating film 3. As shown in FIG. 6, the tungsten plug 5 includes a barrier layer 5a made of titanium nitride and a tungsten layer 5b. The tungsten plug 5 is formed by depositing in order the titanium nitride film and the tungsten film all over the upper side of the substrate 1 to fill in an aperture provided for the interlayer insulating film 3 and then removing the titanium nitride film and the tungsten film outside the aperture by using the CMP. It is difficult to make the surface of the tungsten plug 5 including the metal tungsten layer 5b into smooth by the CMP. In many cases, there exist appreciable concavities and convexities on the surface of the formed tungsten plug 5.

The interlayer insulating film 3 and the memory cell 4 are covered by an interlayer insulating film 6 with a thickness of 200 nm. A word line 7 is provided on the interlayer insulating film 6. The word line 7 is connected to the memory cell 4. As shown in FIG. 5, the word line 7 is formed to extend in the y-axis direction substantially perpendicular to the bit line 2.

As shown in FIG. 4, the memory cell 4 is constituted of a lower magnetic layer 8 and an upper magnetic layer 9 deposited in order, and a tunnel insulating film 10 sandwiched between them. The lower magnetic layer 8, the upper magnetic layer 9 and the tunnel insulating film 10 provide the magnetic tunnel junction. The thickness of the tunnel insulating layer 10 is thin to the extent that a tunnel current flows therethrough, and is typically 1 to 3 nm. The tunnel insulating layer 10 is made of alumina ($Al_2O_3$) manufactured by a plasma oxidation method.

As shown in FIG. 5, the area of the upper magnetic layer 9 is made smaller than the area of the lower magnetic layer 8, and the upper magnetic layer 9 is located inside the lower magnetic layer 8 when viewed from a vertical direction with respect to the substrate.

Figure 7:
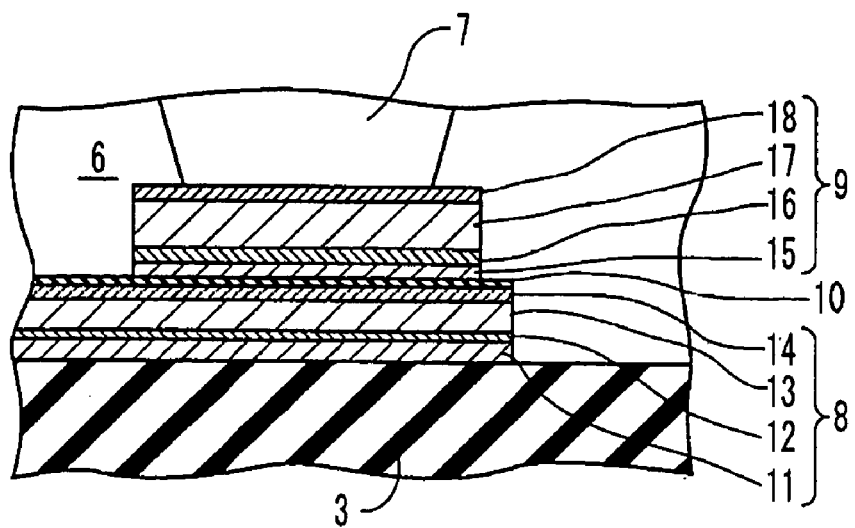
FIG. 7 is a magnified cross sectional view showing the first embodiment of the MRAM according to the present invention.

As shown in FIG. 7, the lower magnetic layer 8 is constituted of a tantalum layer 11, an initial magnetic layer 12 made of permalloy (Ni—Fe), an antiferromagnetic layer 13 made of Ir—Mn and a pinned ferromagnetic layer 14 made of Co—Fe, which are deposited in order. The typical thicknesses of the tantalum layer 11, the initial magnetic layer 12, the antiferromagnetic layer 13 and the pinned ferromagnetic layer 14 are 5 nm, 2 nm, 10 nm and 3 nm, respectively. The pinned ferromagnetic layer 14 is made of ferromagnetic material and has a spontaneous magnetization. The spontaneous magnetization of the pinned ferromagnetic layer 14 is fixed due to interaction from the antiferromagnetic layer 13.

The upper magnetic layer 9 includes a free ferromagnetic layer 15 made of Ni—Fe, a first tantalum layer 16, an aluminum layer 17 and a second tantalum layer 18, which are deposited in order. The typical thicknesses of the free ferromagnetic layer 15, the first tantalum layer 16, the aluminum layer 17 and the second tantalum layer 18 are 5 nm, 5 nm, 20 nm and 5 nm, respectively. The free ferromagnetic layer 15 is made of ferromagnetic material and has a spontaneous magnetization. The free ferromagnetic layer 15 is formed such that its spontaneous magnetization is reversible. The spontaneous magnetization of the free ferromagnetic layer 15 is allowed to be along either the same direction as an orientation of the spontaneous magnetization of the pinned ferromagnetic layer 14 or an opposite direction. The memory cell 4 stores digital data as orientations of the spontaneous magnetization of the free ferromagnetic layer 15.

As shown in FIG. 6, the whole of the upper magnetic layer 9 is formed above the interlayer insulating film 3. The upper magnetic layer 9 does not overlap with the tungsten plug 5 in a vertical direction which is vertical to the surface 1a of the substrate 1. Such a structure prevents occurrence of defects in a tunnel current passage section 10a of the tunnel insulating layer 10 through which the tunnel current flows. The tunnel current passage section 10a is sandwiched between the lower magnetic layer 8 and the upper magnetic layer 9, and the whole of it is located above the interlayer insulating film 3. Since the interlayer insulating film 3 has good smoothness, the tunnel current passage section 10a also has good smoothness. Therefore, the defects such as pin holes hardly occur in the tunnel current passage section 10a. Thus, the whole of the upper magnetic layer 9 is formed above the interlayer insulating film 3, which prevents the occurrence of the defects in the tunnel current passage section 10a of the tunnel insulating layer 10.

Thousand above-mentioned memory cells 4 and thousand memory cells having upper magnetic layers above tungsten plugs were trially manufactured. By comparing those properties, the superiority of the memory cell 4 having the above-mentioned structure was revealed. The size of the upper magnetic layer 9 of the trially manufactured memory cell 4 was 0.6×1.2 μm, the space between the tungsten plug 5 and the upper magnetic layer 9 was 0.2 μm, and the space between the lower magnetic layers 8 was 0.6 μm. According to such a layout, the area of the memory cell is 3.5 μm².

In two of the 1000 memory cells 4 trially manufactured, the lower magnetic layer 8 and the upper magnetic layer 9 were shorted. Furthermore, the average of device resistances of the memory cells 4 was 20 kΩ, and their dispersion was 1.5%. The dispersion of device resistances was small. The MR ratio (magnetoresistive ratio) of the memory cell 4 was 40% when a voltage of 10 mV was applied, and was 15% when a voltage of 400 mV was applied. The memory cell 4 showed excellent magnetoresistive ratio.

On the other hand, as for the 1000 memory cells in which the upper magnetic layers are above the tungsten plugs, 520 memory cells of them were shorted. Moreover, the average of device resistances of non-shorted memory cells was 10 kΩ, and their dispersion was 40%. The dispersion of device resistances was large. Furthermore, their MR ratios range from 10 to 30%. The MR ratios were small, and dispersion of the MR ratios were large. Such a poor property is attributed to the fact that the smoothness of the tunnel insulating film became worse due to roughness of the surface of the tungsten via and a lot of defects occurred in the tunnel insulating film. As described above, the above-mentioned memory cell 4 shows an obvious superiority over the memory cell in which the upper magnetic layer is located above the tungsten plug.

According to the first embodiment, as described above, the whole of the tunnel current passage section 10a determining the property of the memory cell 4 is arranged not to overlap with the tungsten plug 5, and the occurrence of the defects in the tunnel current passage section 10a is suppressed. Thus, the occurrence of failure bits in the MRAM which uses the memory cell 4 as a memory cell is suppressed.

Figure 8:
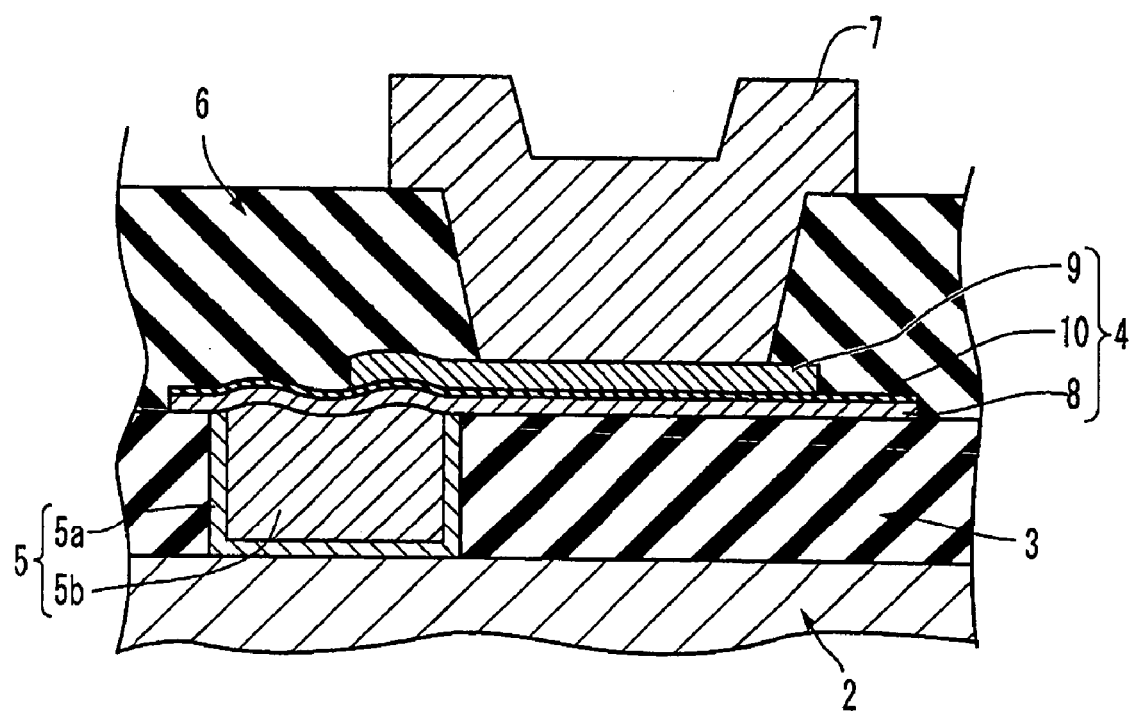
FIG. 8 shows a modification of the first embodiment of the MRAM according to the present invention.

As shown in FIG. 8, an arrangement is possible in the first embodiment in which only a part of the tungsten plug 5 does not overlap with the tunnel current passage section 10a. In the semiconductor apparatus shown in FIG. 8, not all the tunnel current passage section 10a does not overlap with the tungsten plug 5. Such a structure suppresses the occurrence of failure bits in the MRAM to some extent and makes it possible to reduce the area of the memory cell. However, it is preferable from a view point of suppressing the occurrence of failure bits in the MRAM that the whole of the tunnel current passage section 10a is arranged not to overlap with the tungsten plug 5 as shown in FIG. 6.

Second Embodiment

Figure 9:
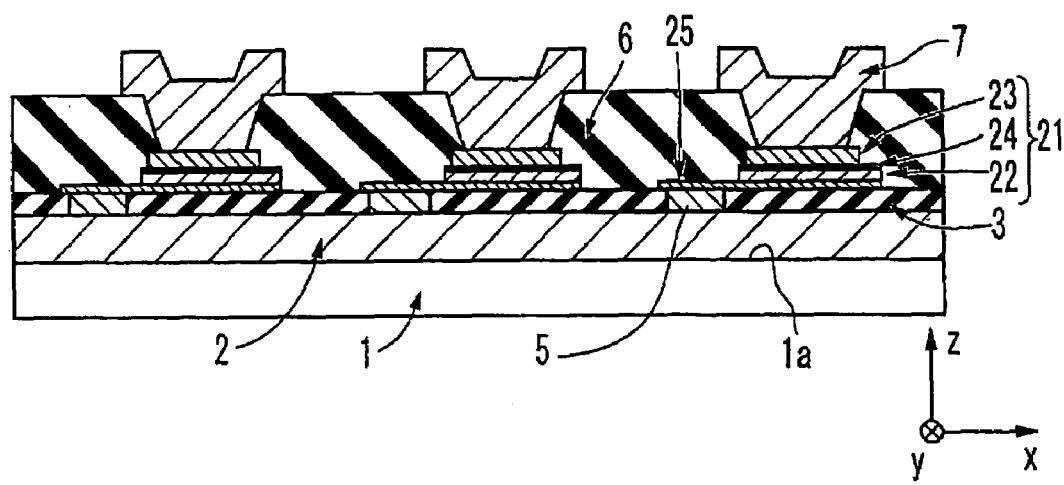
FIG. 9 is a cross sectional view showing a second embodiment of an MRAM according to the present invention.

FIG. 9 shows a second embodiment of an MRAM according to the present invention. The MRAM in the second embodiment is almost similar in structure to the first embodiment. The MRAM according to the second embodiment differs from the MRAM according to the first embodiment in that a memory cell 21 is not directly connected to the tungsten plug 5 but connected to the tungsten plug 5 through a lower electrode layer 25. The structure of the MRAM in the second embodiment will be described in detail hereinafter.

As is the case with the first embodiment, the MRAM in the second embodiment includes the substrate 1, the bit line 2, the interlayer insulating film 3 and the tungsten plug 5. The lower electrode layer 25 is formed on the interlayer insulating film 3. The lower electrode layer 25 is connected to the bit line 2 through the tungsten plug 5. The memory cell 21 is formed on the lower electrode layer 25. The memory cell 21 is covered by the interlayer insulating film 6. The memory cell 21 is connected to the word line 7 formed on the interlayer insulating film 6.

The memory cell 21 is constituted of a lower magnetic layer 22, an upper magnetic layer 23 and a tunnel insulating layer 24 sandwiched between them. The tunnel insulating layer 24 is made of alumina ($Al_2O_3$) manufactured by a plasma oxidation method. The thickness of the tunnel insulating layer 24 is thin to the extent that a tunnel current flows therethrough, and is typically 1 to 3 nm.

Figure 10:
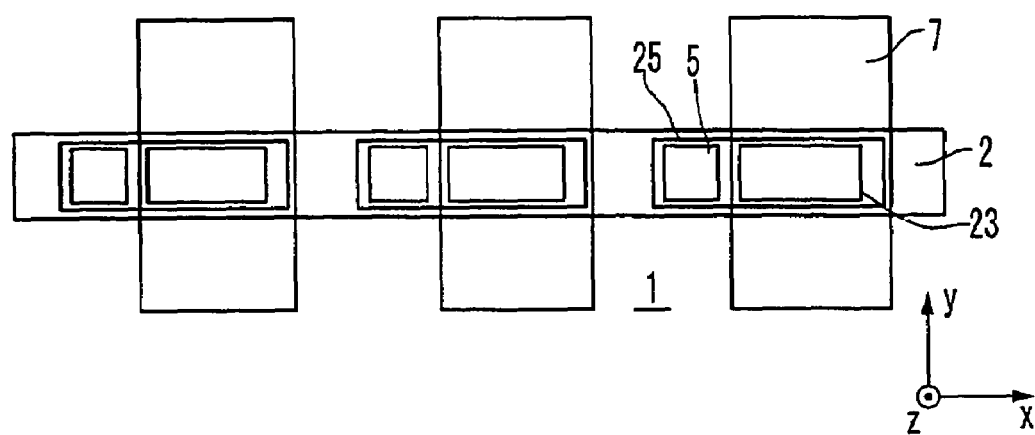
FIG. 10 is a plan view showing the second embodiment of the MRAM according to the present invention.

As shown in FIG. 10, areas of the lower magnetic layer 22, the upper magnetic layer 23 and the tunnel insulating layer 24 are smaller than the lower electrode layer 25. The lower magnetic layer 22, the upper magnetic layer 23 and the tunnel insulating layer 24 are located inside the lower electrode layer 25 when viewed from a vertical direction with respect to the surface 1a of the substrate 1.

Figure 11:
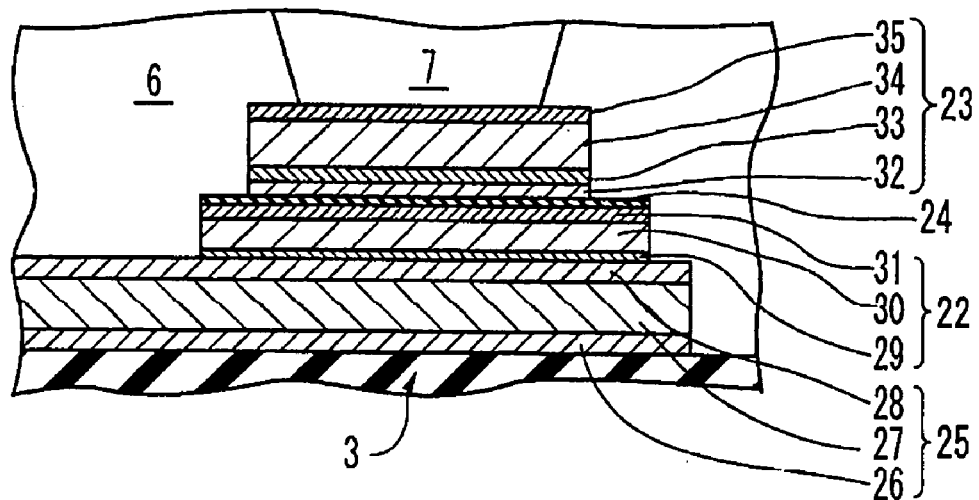
FIG. 11 is a magnified cross sectional view showing the second embodiment of the MRAM according to the present invention.

FIG. 11 shows structures of the memory cell 21 and the lower electrode layer 25 in detail. The lower magnetic layer 22 of the memory cell 21 is constituted of an initial magnetic layer 29 made of permalloy (Ni—Fe), an antiferromagnetic layer 30 made of Ir—Mn and a pinned ferromagnetic layer 31 made of Co—Fe. The typical thicknesses of the initial magnetic layer 29, the antiferromagnetic layer 30 and the pinned ferromagnetic layer 31 are 2 nm, 10 nm and 3 nm, respectively. The pinned ferromagnetic layer 31 is made of ferromagnetic material and has a spontaneous magnetization. The spontaneous magnetization of the pinned ferromagnetic layer 31 is fixed due to interaction from the antiferromagnetic layer 30.

The upper magnetic layer 23 includes a free ferromagnetic layer 32 made of Ni—Fe, a first tantalum layer 33, an aluminum layer 34 and a second tantalum layer 35. The typical thicknesses of the free ferromagnetic layer 32, the first tantalum layer 33, the aluminum layer 34 and the second tantalum layer 35 are 5 nm, 5 nm, 20 nm and 5 nm, respectively. The free ferromagnetic layer 32 is made of ferromagnetic material and has a spontaneous magnetization. The free ferromagnetic layer 32 is formed such that its spontaneous magnetization is reversible. The spontaneous magnetization of the free ferromagnetic layer 32 is allowed to be along either the same direction as an orientation of the spontaneous magnetization of the pinned ferromagnetic layer 31 or an opposite direction. The memory cell 21 stores digital data as orientations of the spontaneous magnetization of the free ferromagnetic layer 32.

Figure 12:
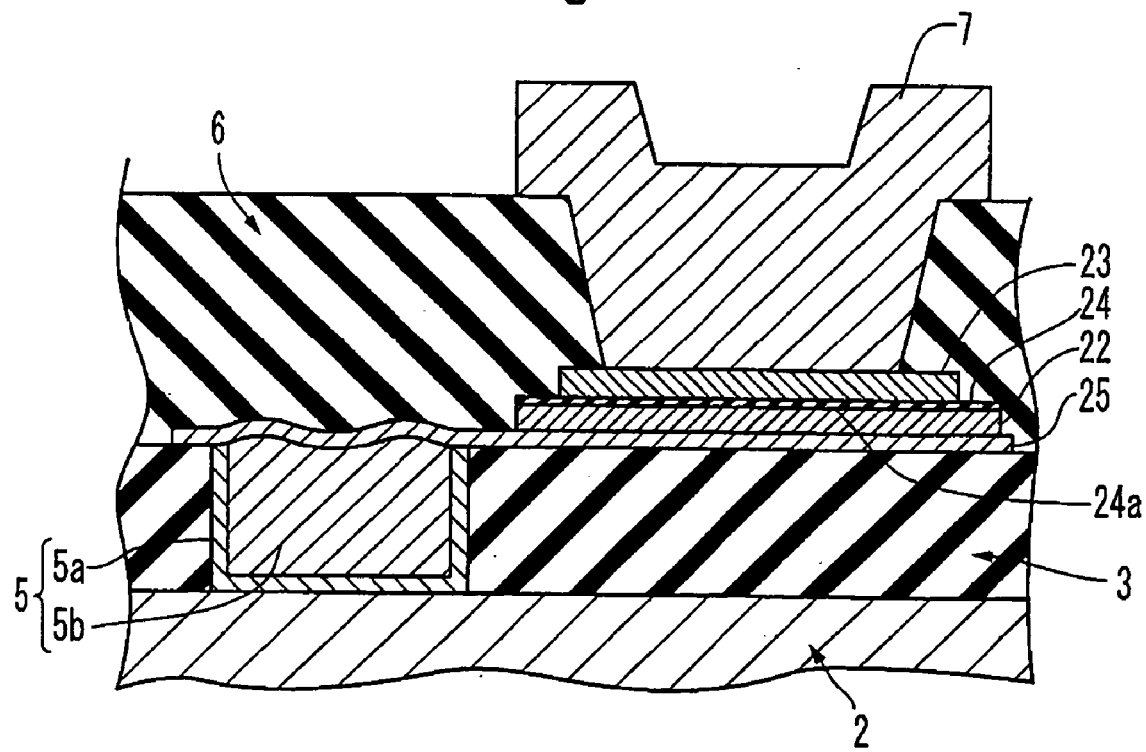
FIG. 12 is a magnified cross sectional view showing the second embodiment of the MRAM according to the present invention.

As shown in FIG. 12, the whole of the upper magnetic layer 23 is formed above the flat interlayer insulating film 3, and the upper magnetic layer 23 does not overlap with the tungsten plug 5 on whose surface concavities and convexities tend to appear. Thus, the smoothness of a tunnel current passage section 24a of the tunnel insulating layer 24 through which the tunnel current flows is improved, and the occurrence of the defects in the tunnel current passage section 24a is prevented. Thus, the occurrence of failure bits is suppressed in the MRAM according to the second embodiment.

On the other hand, as shown in FIG. 11, the lower electrode layer 25 includes a tantalum film 26, an aluminum film 27 and a tantalum film 28, which are formed on the interlayer insulating film 3 in order. The typical thicknesses of the tantalum film 26, the aluminum film 27 and the tantalum film 28 are 5 nm, 50 nm and 5 nm, respectively. The lower electrode layer 25 is configured such that electric resistance of the lower electrode layer 25 along a parallel direction to the surface of the substrate 1 becomes less than electric resistance of the above-mentioned lower magnetic layer 21 along the parallel direction to the surface of the substrate 1.

The lower electrode layer 25 having such a structure plays a role of reducing electric resistance of a tunnel current path and improving an SN ratio of discrimination of stored data, when the structure in which the upper magnetic layer 23 does not overlap with the tungsten plug 5 is adopted.

Due to the adoption of the structure in which the upper magnetic layer 23 does not overlap with the tungsten plug 5, the tunnel current flows in the lower magnetic layer 22 in the direction parallel to the surface of the substrate 1. However, it is not easy to etch the lower magnetic layer 22 made of ferromagnetic material and antiferromagnetic material, and the thickness of the lower magnetic layer 22 needs to be made thin. Thinning of the lower magnetic layer 22 increases the electric resistance of the lower magnetic layer 22 along the parallel direction to the surface of the substrate 1, which increases an SN ratio of the tunnel current flowing in the memory cell 24 at the time of data reading. The presence of the lower electrode layer 25 reduces the electric resistance of the tunnel current path and increases the SN ratio of the tunnel current.

Thousand memory cells 21 having the above-mentioned structure were trially manufactured, and characteristic evaluation was carried out. The size of the upper magnetic layer 23 of the trially manufactured memory cell 21 was 0.6×1.2 μm, the space between the tungsten plug 5 and the upper magnetic layer 23 was 0.2 μm, and the space between the lower magnetic layers 22 was 0.6 μm.

In three of the 1000 memory cells 21 trially manufactured, the lower magnetic layer 22 and the upper magnetic layer 23 were shorted. Furthermore, the average of device resistances of the memory cells 21 was 19 kΩ, and their dispersion was 1.8%. The dispersion of device resistances was small. The MR ratio (magnetoresistive ratio) of the memory cell 21 was 39% when a voltage of 10 mV was applied, and was 15% when a voltage of 400 mV was applied. The memory cell 21 showed excellent magnetoresistive ratio.

According to the second embodiment, as described above, the whole of the tunnel current passage section 24a determining the property of the memory cell 21 is arranged not to overlap with the tungsten plug 5 on whose surface concavities and convexities tend to appear, and the occurrence of the defects in the tunnel current passage section 24a is suppressed. Thus, the occurrence of failure bits in the MRAM which uses the memory cell 21 as a memory cell is suppressed.

Furthermore, according to the second embodiment, the lower electrode layer 25 having lower resistance than the lower magnetic layer 22 is formed under the lower magnetic layer 22, which reduces the electric resistance of the path through which the tunnel current used in the data reading flows. Thus, the SN ratio of the tunnel current increases.

Figure 13:
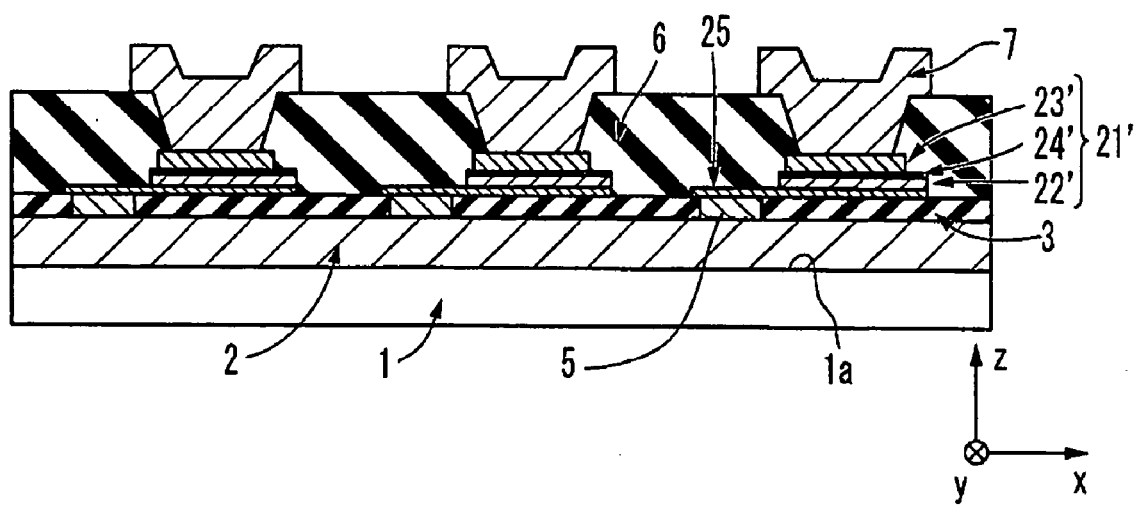
FIG. 13 is a cross sectional view showing a modification of the second embodiment of the MRAM according to the present invention.
Figure 14:
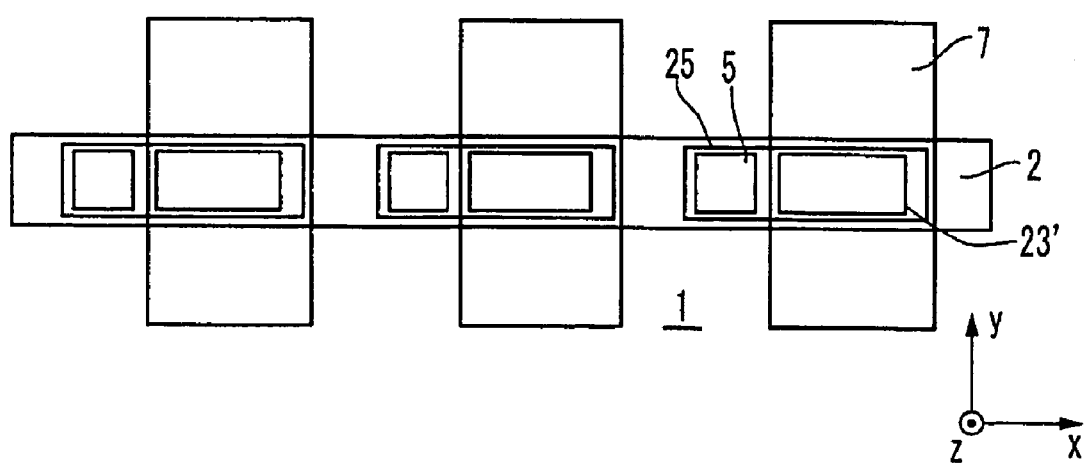
FIG. 14 is a plan view showing the modification of the second embodiment of the MRAM according to the present invention.

In the second embodiment, the memory cell 21 shown in FIG. 9 can be replaced by a memory cell 21' shown in FIG. 13. The memory cell 21' is constituted of a lower magnetic layer 22' formed on the lower electrode layer 25, an upper magnetic layer 23' and a tunnel insulating film 24' sandwiched between them. The difference between the memory cell 21 and the memory cell 21' is as follows. In the memory cell 21, the pinned magnetic layer with the fixed spontaneous magnetization is included in the lower magnetic layer 22 and the free magnetic layer with the reversible spontaneous magnetization is included in the upper magnetic layer 23. To the contrary, in the memory cell 21', the free magnetic layer with the reversible spontaneous magnetization is included in the lower magnetic layer 22' and the pinned magnetic layer with the fixed spontaneous magnetization is included in the upper magnetic layer 23'. As shown in FIG. 14, the areas of the lower magnetic layer 22', the upper magnetic layer 23' and the tunnel insulating layer 24' are smaller than the lower electrode layer 25.

Figure 15:
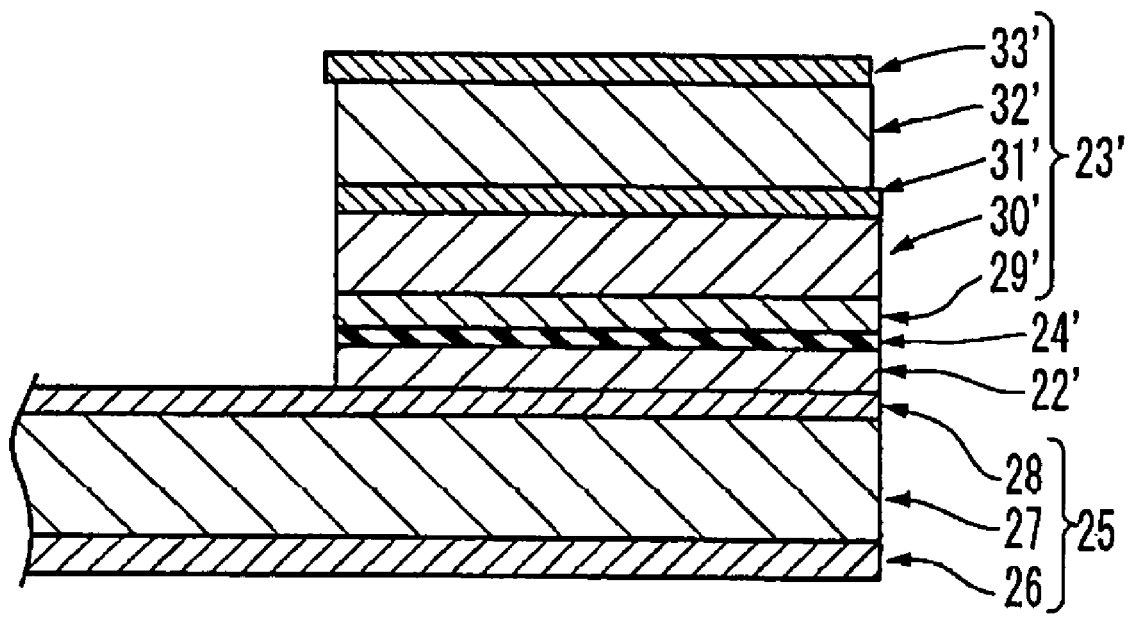
FIG. 15 is a magnified cross sectional view showing the modification of the second embodiment of the MRAM according to the present invention.

FIG. 15 shows the structure of the memory cell 21' in detail. The lower magnetic layer 22' is formed on the tantalum film 28 which is the top layer in the lower electrode layer 25. The lower magnetic layer 22' is a free ferromagnetic layer made of Ni—Fe, and the lower magnetic layer 22' may be described as the free ferromagnetic layer 22' hereinafter. The free ferromagnetic layer 22' is made of ferromagnetic material and has a spontaneous magnetization whose orientation is reversible. Typically, the thickness of the free ferromagnetic layer 22' is 5 nm.

The tunnel insulating layer 24' is formed on the lower magnetic layer 22'. The tunnel insulating layer 24' is made of alumina ($Al_2O_3$) manufactured by a plasma oxidation method. The thickness of the tunnel insulating layer 24' is thin to the extent that the tunnel current flows therethrough, and is typically 1 to 3 nm.

The upper magnetic layer 23' is formed on the tunnel insulating layer 24'. The upper magnetic layer 23' includes a pinned ferromagnetic layer 29' made of Co—Fe, an antiferromagnetic layer 30' made of Ir—Mn, a first tantalum layer 31', an aluminum layer 32' and a second tantalum layer 33'. The pinned ferromagnetic layer 29', the antiferromagnetic layer 30', the first tantalum layer 31', the aluminum layer 32' and the second tantalum layer 33' are formed on the tunnel insulating layer 24' in order. Typical thicknesses of the pinned ferromagnetic layer 29', the antiferromagnetic layer 30', the first tantalum layer 31', the aluminum layer 32' and the second tantalum layer 33' are 3 nm, 10 nm, 5 nm, 20 nm and 5 nm, respectively. The pinned ferromagnetic layer 29' is made of ferromagnetic material and has a spontaneous magnetization. The spontaneous magnetization of the pinned ferromagnetic layer 29' is fixed due to interaction from the antiferromagnetic layer 30.

The memory cell 21' having the structure in which the free ferromagnetic layer 22' is formed on the tantalum film 28 is preferable in that the characteristics of the free ferromagnetic layer 22' can be improved. The tunnel insulating film 24 in the memory cell 21 in FIG. 9 is amorphous, since it is formed by oxidizing an aluminum film. The free ferromagnetic layer 32 formed on such a tunnel insulating film 24 is not good in its orientation. Therefore, there is large dispersion in strength of the magnetic field which is necessary for reversing the spontaneous magnetization of the free ferromagnetic layer 32. On the other hand, the tantalum film 28 made of element metal is a polycrystalline film having orientation to some extent. Therefore, the free ferromagnetic layer 22' formed on the tantalum film 28 as shown in FIG. 15 is good in its orientation. In the free ferromagnetic layer 22' with good orientation, there is small dispersion in strength of the magnetic field which is necessary for reversing its spontaneous magnetization. The small dispersion ensures the data writing and improves reliability of the MRAM.

Third Embodiment

Figure 16:
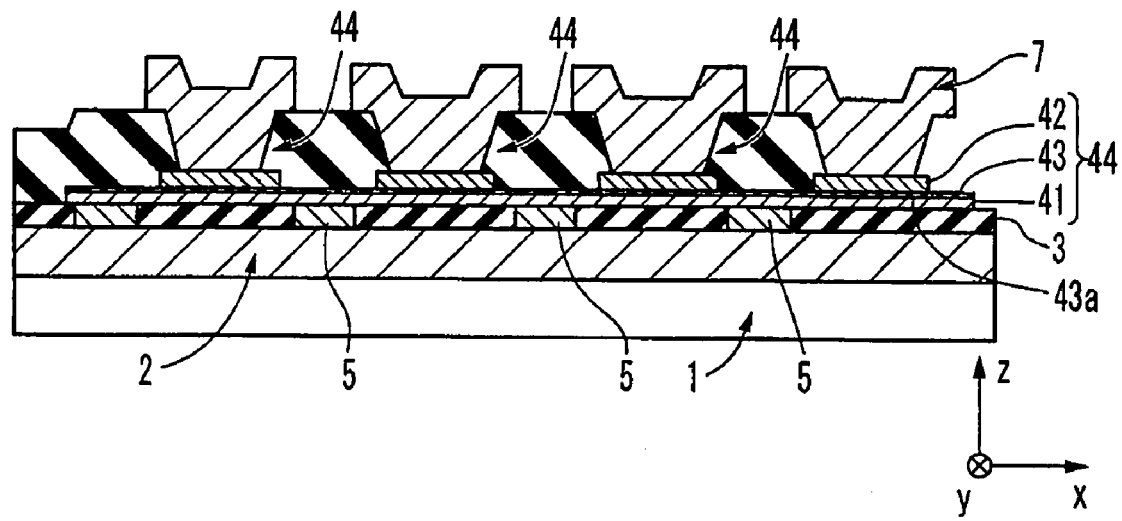
FIG. 16 is a cross sectional view showing a third embodiment of an MRAM according to the present invention.

FIG. 16 shows a third embodiment of an MRAM according to the present invention. The MRAM in the third embodiment is almost similar in structure to the first embodiment. The MRAM according to the third embodiment differs from the MRAM according to the first embodiment in that a lower magnetic layer 41 extends in a direction in which the bit line 2 extends, a plurality of upper magnetic layers 42 are formed on one lower magnetic layer 41 and one tunnel insulating layer 43, and the lower magnetic layer 41 is connected to the bit line 2 with a plurality of tungsten plugs 5. The MRAM in the third embodiment will be described in detail hereinafter.

As is the case with the first embodiment, the MRAM in the third embodiment includes the substrate 1, the bit line 2, the interlayer insulating film 3 and the tungsten plug 5. The lower magnetic layer 41 is formed on the interlayer insulating film 3. As is the case with the lower magnetic layer 8 in the first embodiment, the lower magnetic layer 41 is constituted of a tantalum layer, an initial magnetic layer made of permalloy (Ni—Fe), an antiferromagnetic layer made of Ir—Mn and a pinned ferromagnetic layer made of Co—Fe, which are deposited from the side of the substrate 1 in order. The typical thicknesses of the tantalum layer, the initial magnetic layer, the antiferromagnetic layer and the pinned ferromagnetic layer are 5 nm, 2 nm, 10 nm and 3 nm, respectively. The pinned ferromagnetic layer is a ferromagnetic material and has a spontaneous magnetization. The spontaneous magnetization is fixed due to the antiferromagnetic layer. The lower magnetic layer 41 is formed to extend in the x-axis direction in which the bit line 2 extends, and is connected to the bit line 2 through the plurality of tungsten plugs 5.

The tunnel insulating layer 43 made of alumina ($Al_2O_3$) is formed on the lower magnetic layer 41. The thickness of the tunnel insulating layer 43 is thin to the extent that a tunnel current flows therethrough, and is typically 1 to 3 nm.

The upper magnetic layer 42 is formed on the tunnel insulating layer 43. As is the case with the upper magnetic layer 9 in the first embodiment, the upper magnetic layer 42 includes a free ferromagnetic layer made of Ni—Fe, a first tantalum layer, an aluminum layer and a second tantalum layer, which are deposited from the side of the substrate 1 in order. The typical thicknesses of the free ferromagnetic layer, the first tantalum layer, the aluminum layer and the second tantalum layer are 5 nm, 5 nm, 20 nm and 5 nm, respectively. The free ferromagnetic layer is made of ferromagnetic material and has a spontaneous magnetization. The free ferromagnetic layer is formed such that its spontaneous magnetization is reversible.

Figure 17:
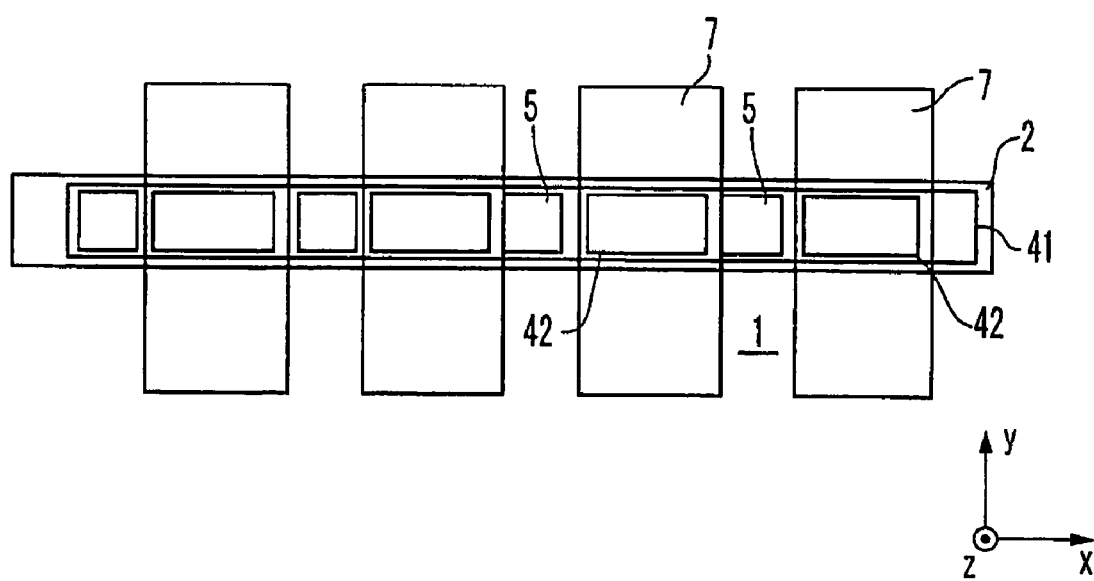
FIG. 17 is a plan view showing the third embodiment of the MRAM according to the present invention.

As shown in FIG. 17, the area of the upper magnetic layer 42 is made smaller than the area of the lower magnetic layer 41, and the upper magnetic layer 42 is located inside the lower magnetic layer 41 when viewed from a vertical direction with respect to the substrate. A memory cell 44 is constituted of the lower magnetic layer 41, the tunnel insulating layer 43 and the upper magnetic layer 42.

As shown in FIG. 16, the whole of the upper magnetic layer 42 is formed above the interlayer insulating film 3, and the upper magnetic layer 42 does not overlap with the tungsten plug 5 on whose surface concavities and convexities tend to appear. Thus, a tunnel current passage section 43a of the tunnel insulating layer 43 through which the tunnel current flows is smoothed, and the occurrence of the defects in the tunnel current passage section 43a is prevented. Thus, the occurrence of failure bits is suppressed in the MRAM according to the third embodiment.

Furthermore, in the MRAM according to the third embodiment, the lower magnetic layers 41 of the memory cells 44 which are adjacent in the x-axis direction are not isolated, and hence its memory cell area is made smaller than that in the first embodiment. In the MRAM according to the first embodiment, as shown in FIG. 4, the lower magnetic layers 8 are isolated every memory cell 4. Therefore, spaces for isolating lower magnetic layers 8 are necessary in the MRAM according to the first embodiment. Due to the spaces, the interval between the upper magnetic layers 9 becomes large. On the other hand, in the MRAM according to the third embodiment, the lower magnetic layer 41 is not isolated every memory cell 44 as shown in FIG. 16. It is therefore possible to make the interval between the upper magnetic layers 42 smaller by that space than the interval between the upper magnetic layers 8 of the MRAM in the first embodiment. Thus, it is possible to make the memory cell area of the MRAM according to the third embodiment smaller than that of the MRAM according to the first embodiment.

Thousand memory cells 44 having the above-mentioned structure were trially manufactured and characteristic evaluation was carried out. The number of shorted memory cells 44, dispersion of device resistances and MR ratio were as good as the first embodiment.

As described above, according to the third embodiment, the occurrence of the defects in the tunnel current passage section 43a is suppressed, and the occurrence of failure bits in the MRAM is suppressed. Furthermore, smaller memory cell area is achieved according to the third embodiment.

Fourth Embodiment

Figure 18:
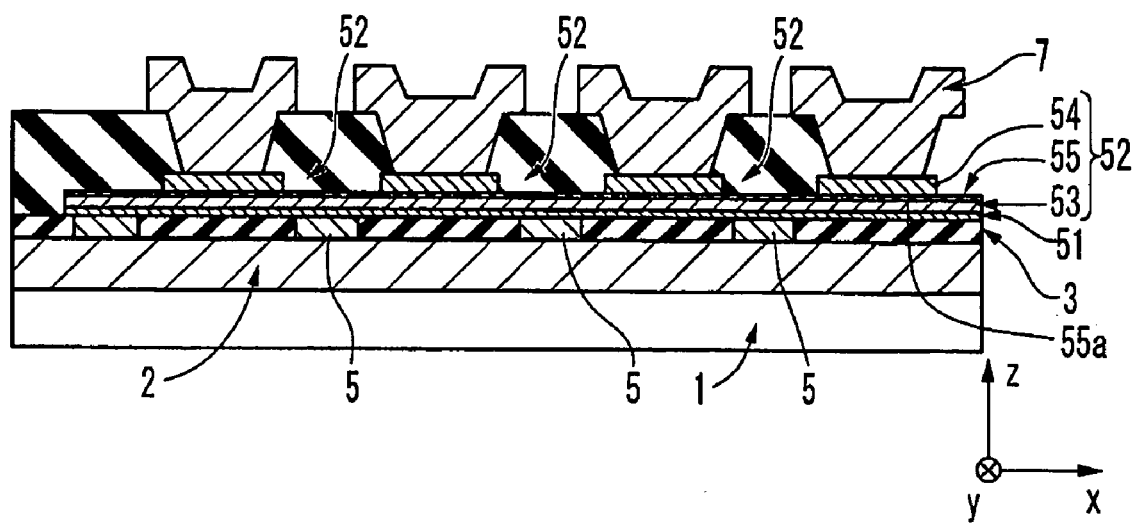
FIG. 18 is a cross sectional view showing a fourth embodiment of an MRAM according to the present invention.

FIG. 18 shows a fourth embodiment of an MRAM according to the present invention. The MRAM in the fourth embodiment is almost similar in structure to the second embodiment. The MRAM according to the fourth embodiment differs from the MRAM according to the second embodiment in that a lower electrode layer 51 extends in a direction (x-axis direction) in which the bit line 2 extends, a plurality of memory cells 45 are formed on one lower electrode layer 51 and the lower electrode layer 51 is connected to the bit line 2 with a plurality of tungsten plugs 5. The MRAM in the fourth embodiment will be described in detail hereinafter.

Figure 19:
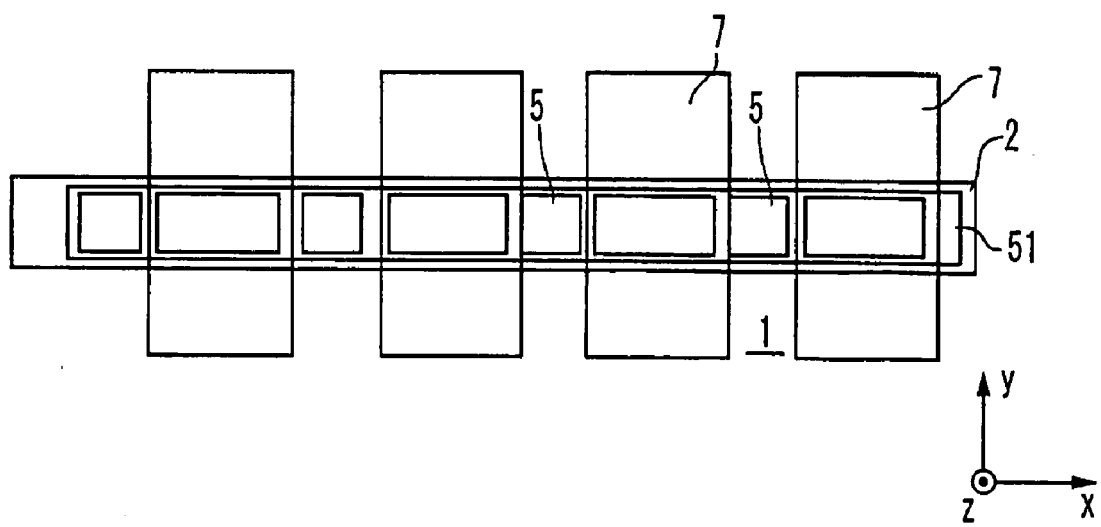
FIG. 19 is a plan view showing the fourth embodiment of the MRAM according to the present invention.

As is the case with the second embodiment, the MRAM in the fourth embodiment includes the substrate 1, the bit line 2, the interlayer insulating film 3 and the tungsten plug 5. The lower electrode layer 51 is formed on the interlayer insulating film 3. As shown in FIG. 19, the lower electrode layer 51 is formed to extend in the x-axis direction in which the bit line 2 extends, and is connected to the bit line 2 through the plurality of tungsten plugs 5. As is the case with the lower electrode layer 25 in the second embodiment, the lower electrode layer 51 includes a first tantalum layer, an aluminum layer and a second tantalum layer, which are deposited from the side of the substrate 1 in order. The typical thicknesses of the first tantalum layer, the aluminum layer and the second tantalum layer are 5 nm, 50 nm and 5 nm, respectively. The lower electrode layer 51 is configured such that electric resistance of the lower electrode layer 51 along a parallel direction to the surface of the substrate 1 becomes less than electric resistance of the after-mentioned lower magnetic layer 53 along the parallel direction to the surface of the substrate 1.

As shown in FIG. 18, a plurality of memory cells 52 are formed on the lower electrode layer 51. The memory cell 52 includes a lower magnetic layer 53, an upper magnetic layer 54 and a tunnel insulating layer 55 sandwiched between them. As is the case with the lower magnetic layer 22 in the second embodiment, the lower magnetic layer 53 is constituted of an initial magnetic layer made of permalloy (Ni—Fe), an antiferromagnetic layer made of Ir—Mn and a pinned ferromagnetic layer made of Co—Fe, which are deposited from the side of the substrate 1 in order. The typical thicknesses of the initial magnetic layer, the antiferromagnetic layer and the pinned ferromagnetic layer are 2 nm, 10 nm and 3 nm, respectively. The pinned ferromagnetic layer is made of ferromagnetic material and has a spontaneous magnetization. The spontaneous magnetization of the pinned ferromagnetic layer is fixed due to interaction from the antiferromagnetic layer.

The tunnel insulating layer 55 is formed on the lower magnetic layer 53. The tunnel insulating layer 55 is made of alumina ($Al_2O_3$). The thickness of the tunnel insulating layer 55 is thin to the extent that a tunnel current flows therethrough, and is typically 1 to 3 nm.

As is the case with the upper magnetic layer 23 in the second embodiment, the upper magnetic layer 64 is constituted of a free ferromagnetic layer made of Ni—Fe, a first tantalum layer, an aluminum layer and a second tantalum layer, which are deposited from the side of the substrate 1 in order and whose thicknesses are 5 nm, 5 nm, 20 nm and 5 nm, respectively. The free ferromagnetic layer is made of ferromagnetic material and has a spontaneous magnetization. The free ferromagnetic layer is formed such that its spontaneous magnetization is reversible.

As shown in FIG. 19, the area of the upper magnetic layer 54 is smaller than that of the lower electrode layer 51, and the upper magnetic layer 54 is located inside the lower electrode layer 51 when viewed from a vertical direction with respect to the surface 1a of the substrate 1.

As shown in FIG. 18, the whole of the upper magnetic layer 54 is formed above the flat interlayer insulating film 3, and the upper magnetic layer 54 does not overlap with the tungsten plug 5 on whose surface concavities and convexities tend to appear. Thus, the smoothness of a tunnel current passage section 55a of the tunnel insulating layer 55 through which the tunnel current flows is improved, and the occurrence of the defects in the tunnel current passage section 55a is prevented. Thus, the occurrence of failure bits is suppressed in the MRAM according to the fourth embodiment.

Furthermore, in the MRAM according to the fourth embodiment, the lower electrode layer 51 is not isolated every memory cell 55, and hence its memory cell area is made smaller than that in the second embodiment. In the MRAM according to the second embodiment, as shown in FIG. 9, the lower electrode layers 25 are isolated every memory cell 21. Therefore, spaces for isolating lower electrode layers 25 are necessary in the MRAM according to the second embodiment. Due to the spaces, the interval between the upper magnetic layers 23 becomes large. On the other hand, in the MRAM according to the fourth embodiment, the lower electrode layer 51 is not isolated every memory cell 44 as shown in FIG. 18. It is therefore possible to make the interval between the upper magnetic layers 54 smaller by that space than the interval between the upper magnetic layers 23 of the MRAM in the second embodiment. Thus, it is possible to make the memory cell area of the MRAM according to the fourth embodiment smaller than that of the MRAM according to the second embodiment.

Thousand memory cells 52 having the above-mentioned structure were trially manufactured and characteristic evaluation was carried out. The number of shorted memory cells 52, dispersion of device resistances and MR ratio were as good as the second embodiment.

As described above, according to the fourth embodiment, the occurrence of the defects in the tunnel current passage section 55a is suppressed, and the occurrence of failure bits in the MRAM is suppressed. Furthermore, smaller memory cell area is achieved according to the fourth embodiment.

Furthermore, according to the fourth embodiment, the lower electrode layer 51 having lower resistance than the lower magnetic layer 53 is formed under the lower magnetic layer 53, which reduces the electric resistance of the path through which the tunnel current used in the data reading flows. Thus, the SN ratio of the tunnel current increases.

Fifth Embodiment

Figure 20:
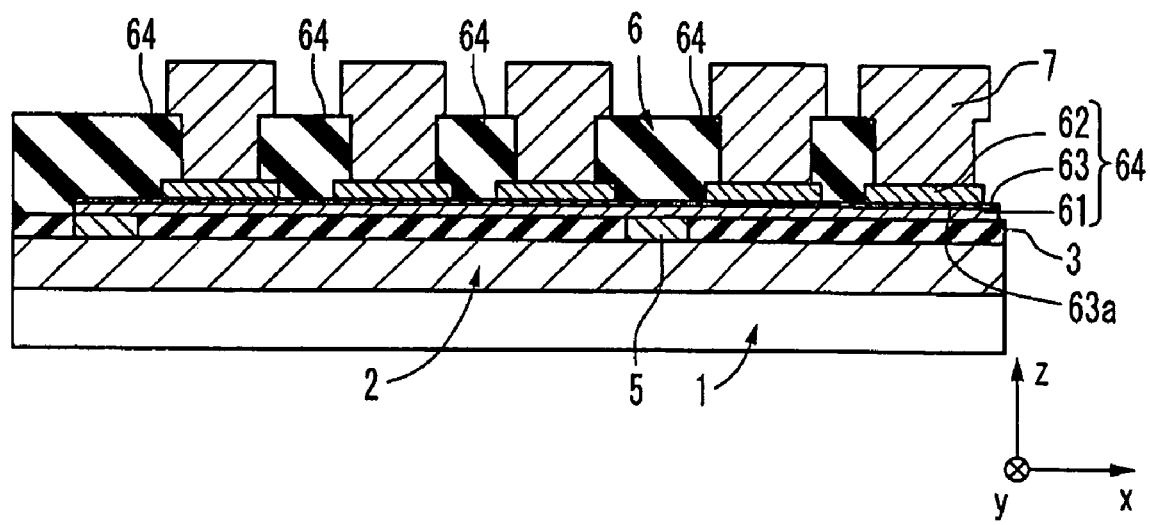
FIG. 20 is a cross sectional view showing a fifth embodiment of an MRAM according to the present invention.

FIG. 20 shows a fifth embodiment of an MRAM according to the present invention. The MRAM in the fifth embodiment is almost similar in structure to the third embodiment. That is to say, in the MRAM according to the fifth embodiment as is the case with the third embodiment, a plurality of upper magnetic layers 62 is formed on one lower magnetic layer 61 and one tunnel insulating layer 63 which are formed to extend in a direction in which the bit line 2 extends.

The MRAM according to the fifth embodiment differs from the MRAM according to the third embodiment in that the number of the tungsten plugs 5 connecting the one lower magnetic layer 61 with the bit line 2 is smaller than the number of the upper magnetic layers 62 formed above the lower magnetic layer 61. The MRAM in the fifth embodiment will be described in detail hereinafter.

Figure 21:
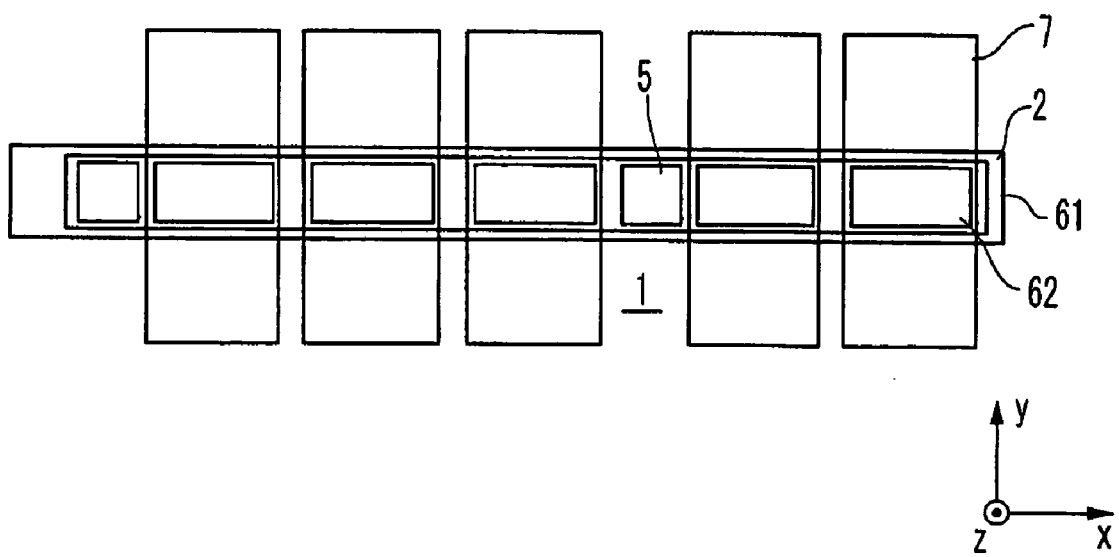
FIG. 21 is a plan view showing the fifth embodiment of the MRAM according to the present invention.

As is the case with the third embodiment, the MRAM in the fifth embodiment includes the substrate 1, the bit line 2, the interlayer insulating film 3 and the tungsten plug 5. The lower magnetic layer 61 is formed on the interlayer insulating film 3. As is the case with the lower magnetic layer 8 in the first embodiment, the lower magnetic layer 61 is constituted of a tantalum layer, an initial magnetic layer made of permalloy (Ni—Fe), an antiferromagnetic layer made of Ir—Mn and a pinned ferromagnetic layer made of Co—Fe, which are deposited from the side of the substrate 1 in order. The typical thicknesses of the tantalum layer, the initial magnetic layer, the antiferromagnetic layer and the pinned ferromagnetic layer are 5 nm, 2 nm, 10 nm and 3 nm, respectively. The pinned ferromagnetic layer is a ferromagnetic material and has a spontaneous magnetization. The spontaneous magnetization is fixed due to the antiferromagnetic layer. As shown in FIG. 21, the lower magnetic layer 61 is formed to extend in the x-axis direction in which the bit line 2 extends. As shown in FIG. 20, the lower magnetic layer 61 is connected to the bit line 2 through the tungsten plug 5.

The tunnel insulating layer 63 made of alumina ($Al_2O_3$) is formed on the lower magnetic layer 61. The thickness of the tunnel insulating layer 63 is thin to the extent that a tunnel current flows therethrough, and is typically 1 to 3 nm.

The upper magnetic layer 62 is formed on the tunnel insulating layer 63. As is the case with the upper magnetic layer 9 in the first embodiment, the upper magnetic layer 62 includes a free ferromagnetic layer made of Ni—Fe, a first tantalum layer, an aluminum layer and a second tantalum layer, which are deposited from the side of the substrate 1 in order. The typical thicknesses of the free ferromagnetic layer, the first tantalum layer, the aluminum layer and the second tantalum layer are 5 nm, 5 nm, 20 nm and 5 nm, respectively. The free ferromagnetic layer is made of ferromagnetic material and has a spontaneous magnetization. The free ferromagnetic layer is formed such that its spontaneous magnetization is reversible.

As shown in FIG. 21, the area of the upper magnetic layer 62 is made smaller than the area of the lower magnetic layer 41, and the upper magnetic layer 62 is located inside the lower magnetic layer 61 when viewed from a vertical direction with respect to the substrate. A memory cell 64 is constituted of the lower magnetic layer 61, the tunnel insulating layer 63 and the upper magnetic layer 62.

As shown in FIG. 20, the whole of the upper magnetic layer 62 is formed above the interlayer insulating film 3, and the upper magnetic layer 62 does not overlap with the tungsten plug 5 on whose surface concavities and convexities tend to appear. Thus, a tunnel current passage section 63a of the tunnel insulating layer 63 through which the tunnel current flows is smoothed, and the occurrence of the defects in the tunnel current passage section 43a is prevented. Thus, the occurrence of failure bits is suppressed in the MRAM according to the third embodiment.

According to the MRAM in the fifth embodiment, the number of the tungsten plugs 5 connected to one lower magnetic layer 61 is smaller than the number of the upper magnetic layers 62 formed over the one lower magnetic layer 61. That is to say, it is not like that one tungsten plug 5 is provided for one upper magnetic layer 62. By making the number of the tungsten plug 5 smaller than the number of the upper magnetic layers 62 as shown in FIG. 21, it becomes possible to arrange the upper magnetic layers 62 more compactly and to miniaturize the memory cell area.

The number of the tungsten plugs 5 connected to one lower magnetic layer 61 is not limited to a plural number. The number of the tungsten plugs 5 connected to one lower magnetic layer 61 being small is preferable in the miniaturization of the memory cell area.

Thousand memory cells 64 having the above-mentioned structure were trially manufactured and characteristic evaluation was carried out. The number of shorted memory cells 64, dispersion of device resistances and MR ratio were as good as the first embodiment.

As described above, according to the fifth embodiment, the occurrence of the defects in the tunnel current passage section 63a is suppressed, and the occurrence of failure bits in the MRAM is suppressed. Furthermore, smaller memory cell area is achieved according to the fifth embodiment.

Sixth Embodiment

Figure 22:
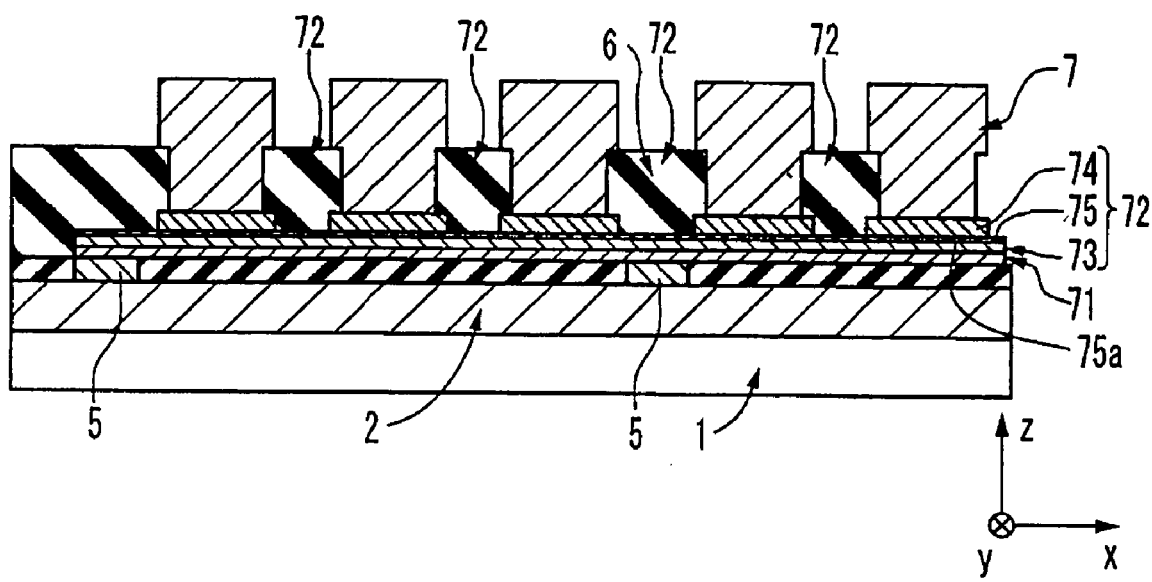
FIG. 22 is a cross sectional view showing a sixth embodiment of an MRAM according to the present invention.

FIG. 22 shows a sixth embodiment of an MRAM according to the present invention. The MRAM in the sixth embodiment is almost similar in structure to the fourth embodiment. That is to say, in the MRAM according to the sixth embodiment as is the same with the fourth embodiment, a plurality of memory cells 72 are formed on one lower electrode layer 71 which are formed to extend in a direction in which the bit line 2 extends.

The MRAM according to the sixth embodiment differs from the MRAM according to the fourth embodiment in that the number of the tungsten plugs 5 connecting the one lower electrode layer 71 with the bit line 2 is smaller than the number of the memory cells 72 formed over the lower magnetic layer 71. The MRAM in the sixth embodiment will be described in detail hereinafter.

Figure 23:
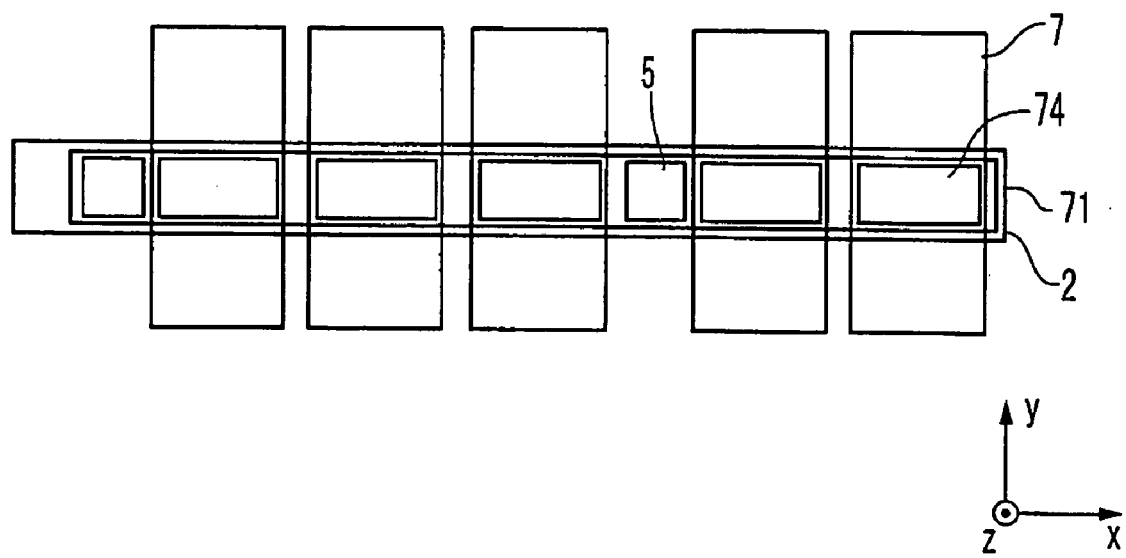
FIG. 23 is a plan view showing the sixth embodiment of the MRAM according to the present invention.

As is the case with the second embodiment, the MRAM in the sixth embodiment includes the substrate 1, the bit line 2, the interlayer insulating film 3 and the tungsten plug 5. The lower electrode layer 71 is formed on the interlayer insulating film 3. As shown in FIG. 23, the lower electrode layer 71 is formed to extend in the x-axis direction in which the bit line 2 extends. As shown in FIG. 22, the lower electrode layer 71 is connected to the bit line 2 through the tungsten plug 5. As is the case with the lower electrode layer 25 in the second embodiment, the lower electrode layer 71 includes a first tantalum layer, an aluminum layer and a second tantalum layer, which are deposited from the side of the substrate 1 in order. The typical thicknesses of the first tantalum layer, the aluminum layer and the second tantalum layer are 5 nm, 50 nm and 5 nm, respectively. The lower electrode layer 71 is configured such that electric resistance of the lower electrode layer 71 along a parallel direction to the surface of the substrate 1 becomes less than electric resistance of the after-mentioned lower magnetic layer 73 along the parallel direction to the surface of the substrate 1.

As shown in FIG. 22, a plurality of memory cells 72 are formed on the lower electrode layer 71. The memory cell 72 includes a lower magnetic layer 73, an upper magnetic layer 74 and a tunnel insulating layer 76 sandwiched between them. As is the case with the lower magnetic layer 22 in the second embodiment, the lower magnetic layer 73 is constituted of an initial magnetic layer made of permalloy (Ni—Fe), an antiferromagnetic layer made of Ir—Mn and a pinned ferromagnetic layer made of Co—Fe, which are deposited from the side of the substrate 1 in order. The typical thicknesses of the initial magnetic layer, the antiferromagnetic layer and the pinned ferromagnetic layer are 2 nm, 10 nm and 3 nm, respectively. The pinned ferromagnetic layer is made of ferromagnetic material and has a spontaneous magnetization. The spontaneous magnetization of the pinned ferromagnetic layer is fixed due to interaction from the antiferromagnetic layer.

The tunnel insulating layer 75 is formed on the lower magnetic layer 73. The tunnel insulating layer 75 is made of alumina ($Al_2O_3$). The thickness of the tunnel insulating layer 75 is thin to the extent that a tunnel current flows therethrough, and is typically 1 to 3 nm.

The upper magnetic layer 74 is formed on the tunnel insulating layer 75. As is the case with the upper magnetic layer 23 in the second embodiment, the upper magnetic layer 74 is constituted of a free ferromagnetic layer made of Ni—Fe, a first tantalum layer, an aluminum layer and a second tantalum layer, which are deposited from the side of the substrate 1 in order. The typical thicknesses of the free ferromagnetic layer, the first tantalum layer, the aluminum layer and the second tantalum layer are 5 nm, 5 nm, 20 nm and 5 nm, respectively. The free ferromagnetic layer is made of ferromagnetic material and has a spontaneous magnetization. The free ferromagnetic layer is formed such that its spontaneous magnetization is reversible.

As shown in FIG. 23, the areas of the lower magnetic layer 73, the upper magnetic layer 74 and the tunnel insulating layer 75 are smaller than the lower electrode layer 71. The lower magnetic layer 73, the upper magnetic layer 74 and the tunnel insulating layer 75 are located inside the lower electrode layer 71 when viewed from a vertical direction with respect to the surface 1a of the substrate 1.

As shown in FIG. 22, the whole of the upper magnetic layer 74 is formed above the flat interlayer insulating film 3, and the upper magnetic layer 74 does not overlap with the tungsten plug 5 on whose surface concavities and convexities tend to appear. Thus, the smoothness of a tunnel current passage section 75a of the tunnel insulating layer 75 through which the tunnel current flows is improved, and the occurrence of the defects in the tunnel current passage section 75a is prevented. Thus, the occurrence of failure bits is suppressed in the MRAM according to the seventh embodiment.

Moreover, according to the MRAM in the sixth embodiment, the number of the tungsten plugs 5 connected to one lower electrode layer 71 is smaller than the number of the memory cells 72 formed over the one lower electrode layer 71. That is to say, it is not like that one tungsten plug 5 is provided for one memory cell 72. By making the number of the tungsten plus 5 smaller than the number of the memory cells 72 as shown in FIG. 22, it becomes possible to arrange the memory cells 72 more compactly and to miniaturize the memory cell area.

Here, it should be noted that the number of the tungsten plugs 5 connected to one lower electrode layer 71 is not limited to a plural number. The number of the tungsten plugs 5 connected to one lower electrode layer 71 being small is preferable in the miniaturization of the memory cell area.

Thousand memory cells 72 having the above-mentioned structure were trially manufactured and characteristic evaluation was carried out. The number of shorted memory cells 72, dispersion of device resistances and MR ratio were as good as the first embodiment.

As described above, according to the sixth embodiment, the occurrence of the defects in the tunnel current passage section 75a is suppressed, and the occurrence of failure bits in the MRAM is suppressed. Furthermore, smaller memory cell area is achieved according to the sixth embodiment.

Furthermore, according to the sixth embodiment, the lower electrode layer 71 having lower resistance than the lower magnetic layer 73 is formed under the lower magnetic layer 73, which reduces the electric resistance of the path through which the tunnel current used in the data reading flows. Thus, the SN ratio of the tunnel current increases.

Seventh Embodiment

Figure 24:
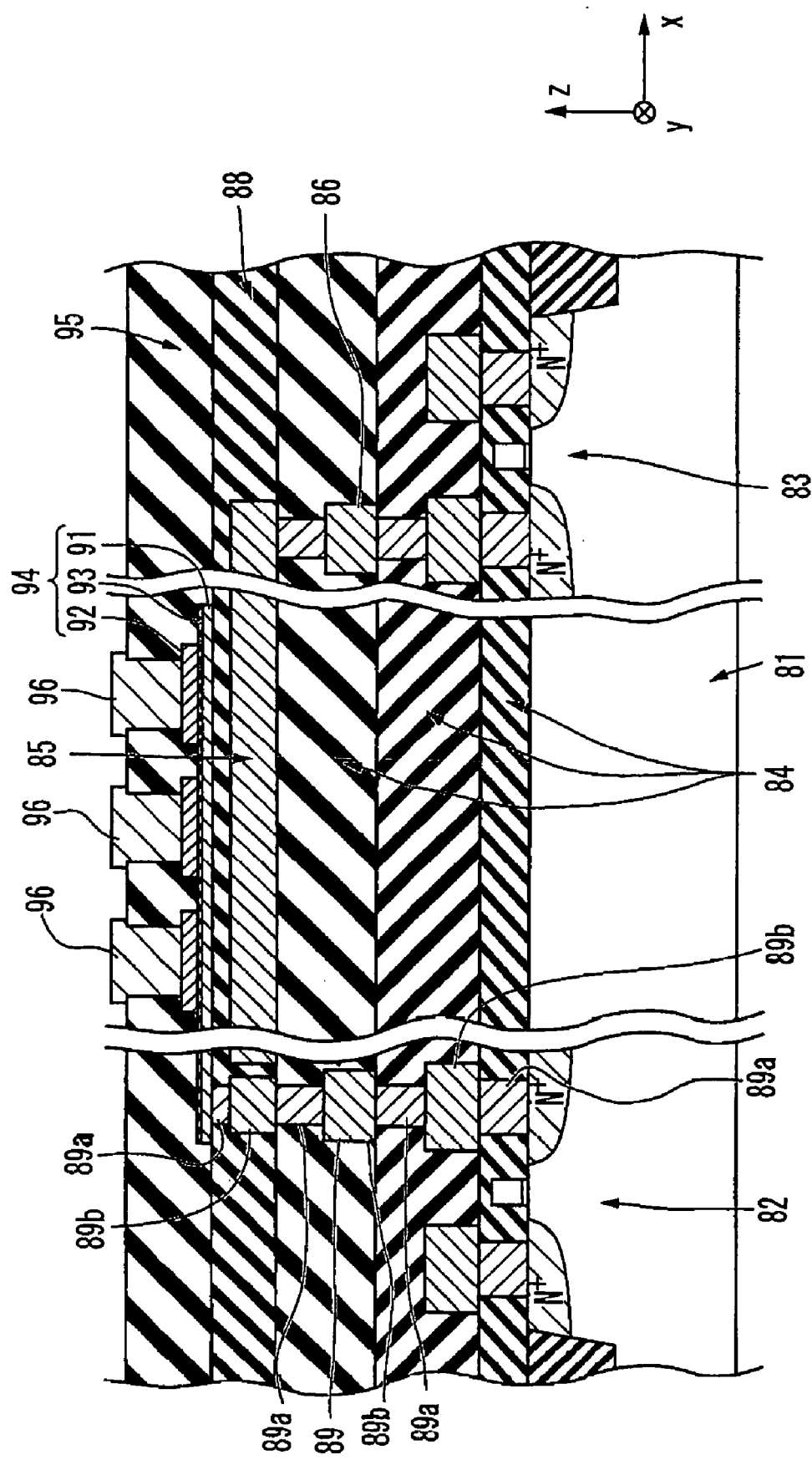
FIG. 24 is a cross sectional view showing a seventh embodiment of an MRAM according to the present invention.

FIG. 24 shows a seventh embodiment of an MRAM according to the present invention. In the MRAM according to the seventh embodiment, unlike the MRAM according to the fifth embodiment, a tungsten plug electrically connecting a lower magnetic layer 91 with a bit line 85 is not formed. The lower magnetic layer 91 is connected to a read row selector transistor 82, the bit line 85 is connected to a write row selector transistor 83, and the lower magnetic layer 91 is electrically isolated from the bit line 85. Since the tungsten plug electrically connecting the lower magnetic layer 91 with the bit line 85 is eliminated, further dense distribution of memory cells 94 becomes possible. In accordance with the change in the configuration, data writing and reading in the MRAM of the seventh embodiment are carried out in a different way from the method in the public domain. The MRAM according to the seventh embodiment will be described in detail hereinafter.

The MRAM in the seventh embodiment has a substrate 81. On the surface of the substrate 81, the read row selector transistor 82 and write row selector transistor 83 are formed. The row selector transistor 82 and the write row selector transistor 83 are MOSFETs (Metal Oxide Semiconductor Field Effect Transistor). The substrate 81 is covered by a laminated interlayer insulating film 84. The bit line 85 is formed on the top layer of the interlayer insulating film 84. The bit line 85 is electrically connected to source/drain of the write row selector transistor 83 through a stacked via 86. The bit line 85 is covered by an interlayer insulating film 88. The interlayer insulating film 88 is planarized to be flat by the CMP.

The lower magnetic layer 91 is formed on the interlayer insulating film 88. As is the case with the lower magnetic layer 8 in the first embodiment, the lower magnetic layer 91 is constituted of a tantalum layer, an initial magnetic layer made of permalloy (Ni—Fe), an antiferromagnetic layer made of Ir—Mn and a pinned ferromagnetic layer made of Co—Fe, which are deposited from the side of the substrate 81 in order. The typical thicknesses of the tantalum layer, the initial magnetic layer, the antiferromagnetic layer and the pinned ferromagnetic layer are 5 nm, 2 nm, 10 nm and 3 nm, respectively. The pinned ferromagnetic layer is a ferromagnetic material and has a spontaneous magnetization. The spontaneous magnetization of the pinned ferromagnetic layer is fixed due to the antiferromagnetic layer. The lower magnetic layer 91 is formed to extend in the x-axis direction in which the bit line 85 extends.

The lower magnetic layer 91 is electrically connected to source/drain of the read row selector transistor 82 through a stacked via 89. The stacked via 89 includes tungsten plugs 89a and lands 89b which are alternately laminated in series. The tungsten plug 89a has the same structure as the tungsten plug 5 described in the first embodiment. In many cases, there exist appreciable concavities and convexities on the surface of the tungsten plug 89a. At the tungsten plug 89a with such a structure, the lower magnetic layer 91 is connected to the stacked via 89.

On the lower magnetic layer 91, a tunnel insulating layer 93 made of alumina ($Al_2O_3$) is formed. The thickness of the tunnel insulating layer 93 is thin to the extent that a tunnel current flows therethrough, and is typically 1 to 3 nm.

An upper ferromagnetic layer 92 is formed on the tunnel insulating layer 93. As is the case with the upper magnetic layer 9 in the first embodiment, the upper magnetic layer 92 includes a free ferromagnetic layer made of Ni—Fe, a first tantalum layer, an aluminum layer and a second tantalum layer, which are deposited from the side of the substrate 1 in order. The typical thicknesses of the free ferromagnetic layer, the first tantalum layer, the aluminum layer and the second tantalum layer are 5 nm, 5 nm, 20 nm and 5 nm, respectively. The free ferromagnetic layer is made of ferromagnetic material and has a spontaneous magnetization. The free ferromagnetic layer is formed such that its spontaneous magnetization is reversible.

The lower magnetic layer 91, the upper magnetic layer 92 and the tunnel insulating layer 93 provide the memory cell 94.

Figure 25:
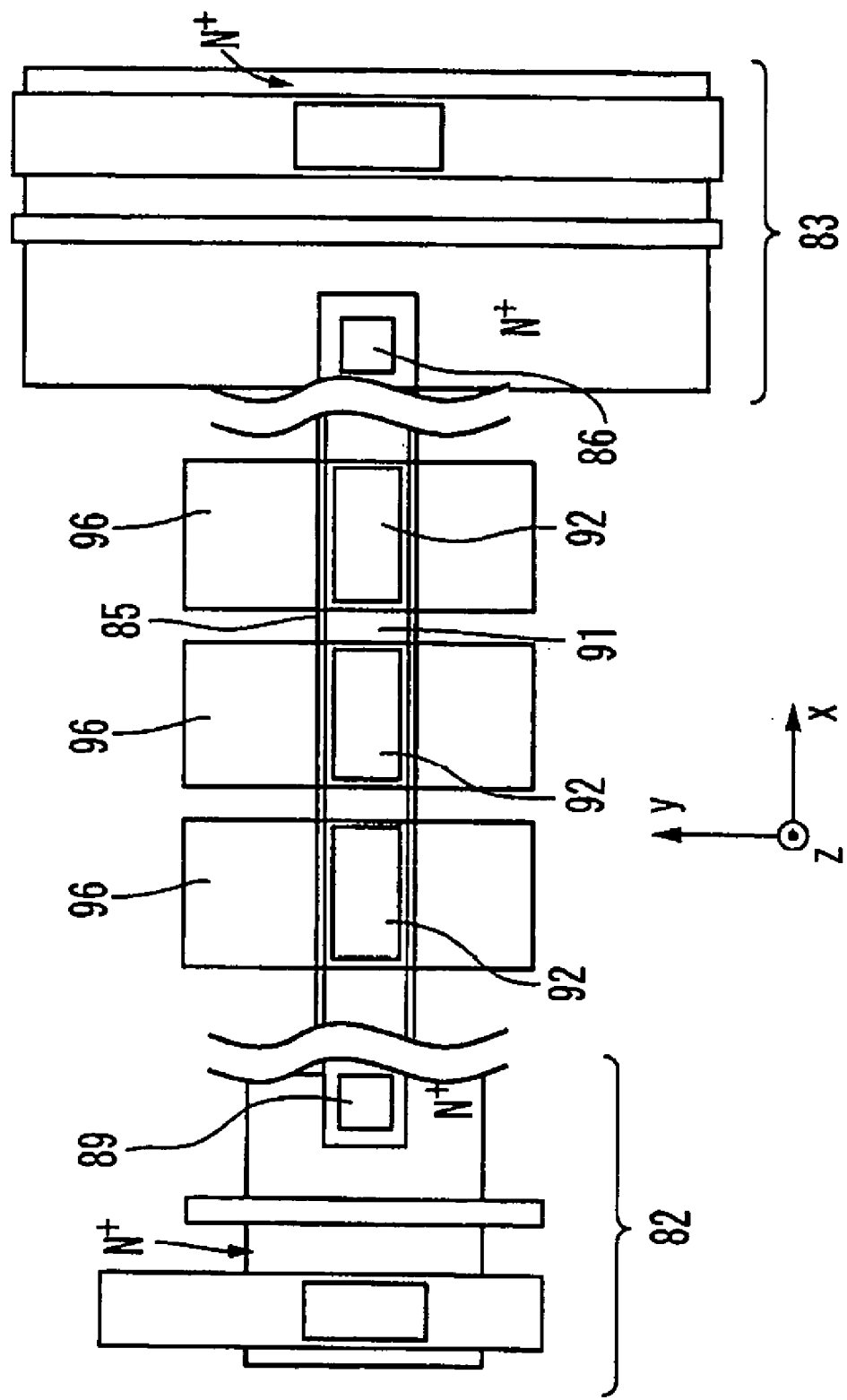
FIG. 25 is a plan view showing the seventh embodiment of the MRAM according to the present invention.

The memory cell 94 is covered by an interlayer insulating film 95. A word line 96 is formed on the interlayer insulating film 95. The word line 96 is electrically connected to the upper magnetic layer 92 of the memory cell 94 through a contact hole provided for the interlayer insulating film 95. As shown in FIG. 25, the word line 96 is formed to extend in the y-axis direction which is substantially perpendicular to the x-axis direction in which the bit line 85 extends.

As shown in FIG. 24, the whole of the upper magnetic layer 92 is formed above the planarized interlayer insulating film 88, and does not overlap with the tungsten plug 89a on whose surface concavities and convexities tend to appear. Such a structure improves the smoothness of a tunnel current passage section of the tunnel insulating layer 93 through which the tunnel current flows, and prevents the occurrence of the defects in the tunnel current passage section. Thus, the occurrence of failure bits is suppressed in the MRAM according to the seventh embodiment.

Figure 26:
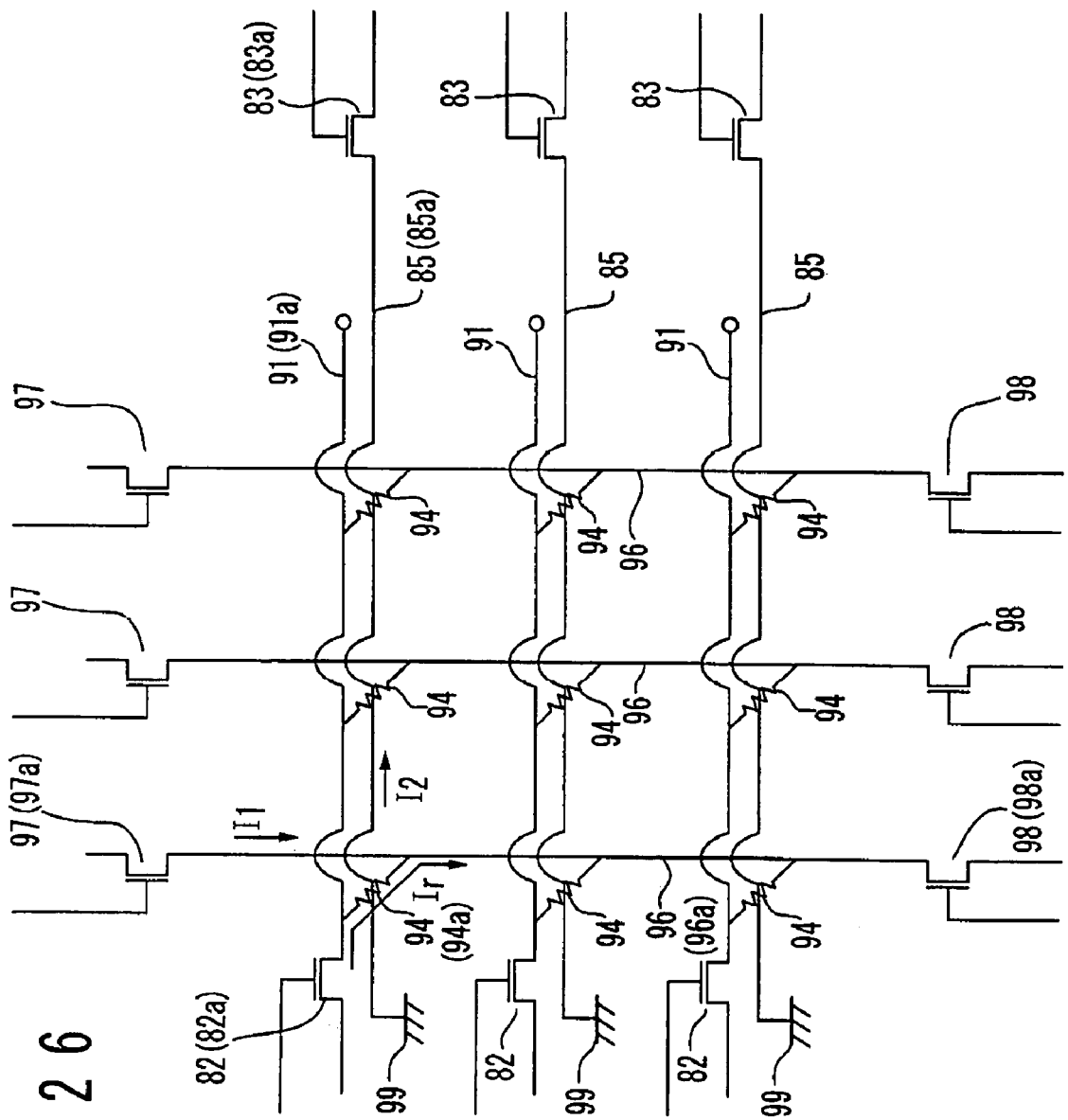
FIG. 26 is a figure showing an equivalent circuit of the MRAM according to the seventh embodiment.

In the MRAM having such a structure according to the seventh embodiment, the data writing and reading are carried out in a different way from the conventional MRAM. FIG. 26 is an equivalent circuit of the MRAM according to the seventh embodiment. As described above, the bit line 85 and the lower magnetic layer 91 are formed to extend in the x-axis direction and cross the word line 96 extending in the y-axis direction. One end of the bit line 85 is connected to a terminal 99 having a predetermined potential (typically, ground potential), and the other end is connected to the previously-mentioned write row selector transistor 83. One end of the lower magnetic layer 91 is connected to the previously-mentioned row selector transistor 82, and the other end is open. One end of the word line 96 is connected to a column selector transistor 97, and the other end is connected to a column selector transistor 98.

The memory cells 94 that function as memory cell is arranged to form an array. The memory cell 94 electrically bridges the lower magnetic layer 91 and the word line 96, while is not electrically connected to the bit line 85. The bit line 85 is used only for applying a magnetic field to the memory cell 94 at the time of the data writing and is not used at the time of the data reading. In the data reading, the lower magnetic layer 91 itself is used as a bit line. The bit line 85 used only in the data writing is hereinafter referred to as a write bit line 85, and the lower magnetic layer 91 is hereinafter referred to as a read bit line 91.

The writing of data to the memory cell 94 is carried out as follows. For example, let us consider a case when a data is written to a memory cell 94a of the memory cells 94. First, a word line 96a and a write bit line 85a which cross near the memory cell 94a are selected. Column selector transistors 97a, 98a connected with both ends of the selected word line 96a are activated, and a write current $I_1$ is supplied to the word line 96a. Further, the write selector transistor 83a connected with the selected write bit line 85a is activated, and a write current $I_2$ is supplied to the write bit line 85. The write currents $I_1$, $I_2$ are typically in a range from a few mA to a few tens of mA. Due to magnetic fields generated by the write current $I_1$ and the write current $I_2$, the data is written to the memory cell 94.

On the other hand, reading of data from the memory cell 94 is carried out as follows. For example, in the case when data is read out from the above-mentioned memory cell 94a, the word line 96a and a read bit line (lower magnetic layer) 91a which cross the memory cell 94a are first selected. Next, the column selector transistor 98a connected to one end of the word line 96a is activated, and the read row selector transistor 82 connected to the read bit line 91a is activated. Next, a voltage is applied between the word line 96a and the read bit line 91a, and the read current $I_r$ flows through the memory cell 94a. The read current $I_r$ is typically a few μA. Based on the read current $I_r$, the data stored in the memory cell 94a is identified.

Figure 1:
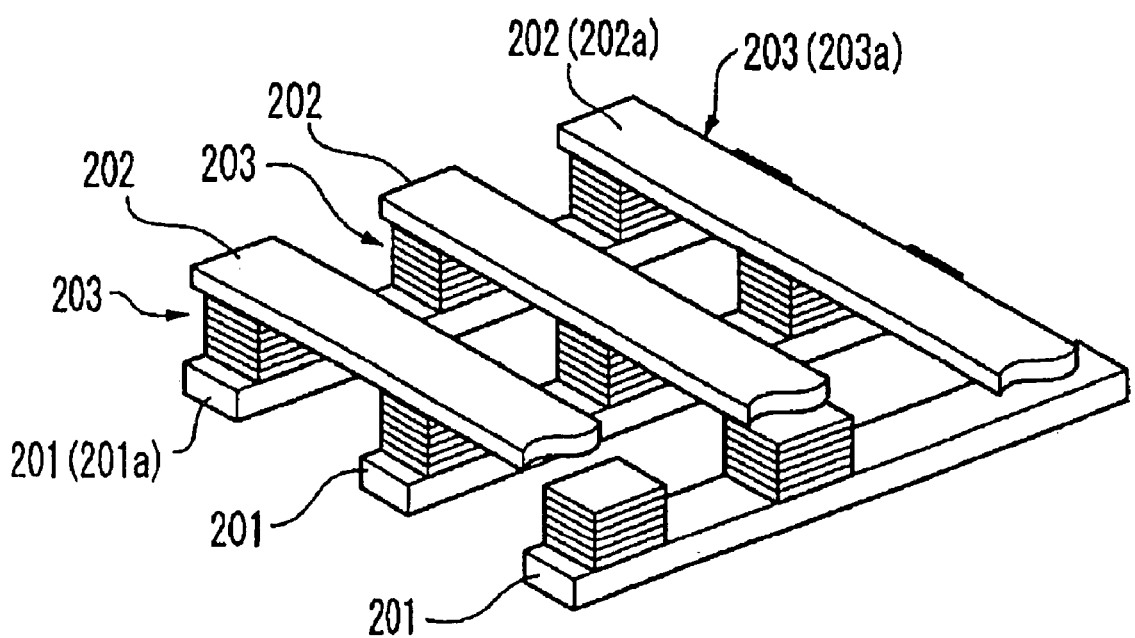
FIG. 1 shows a conventional MRAM.
Figure 2:
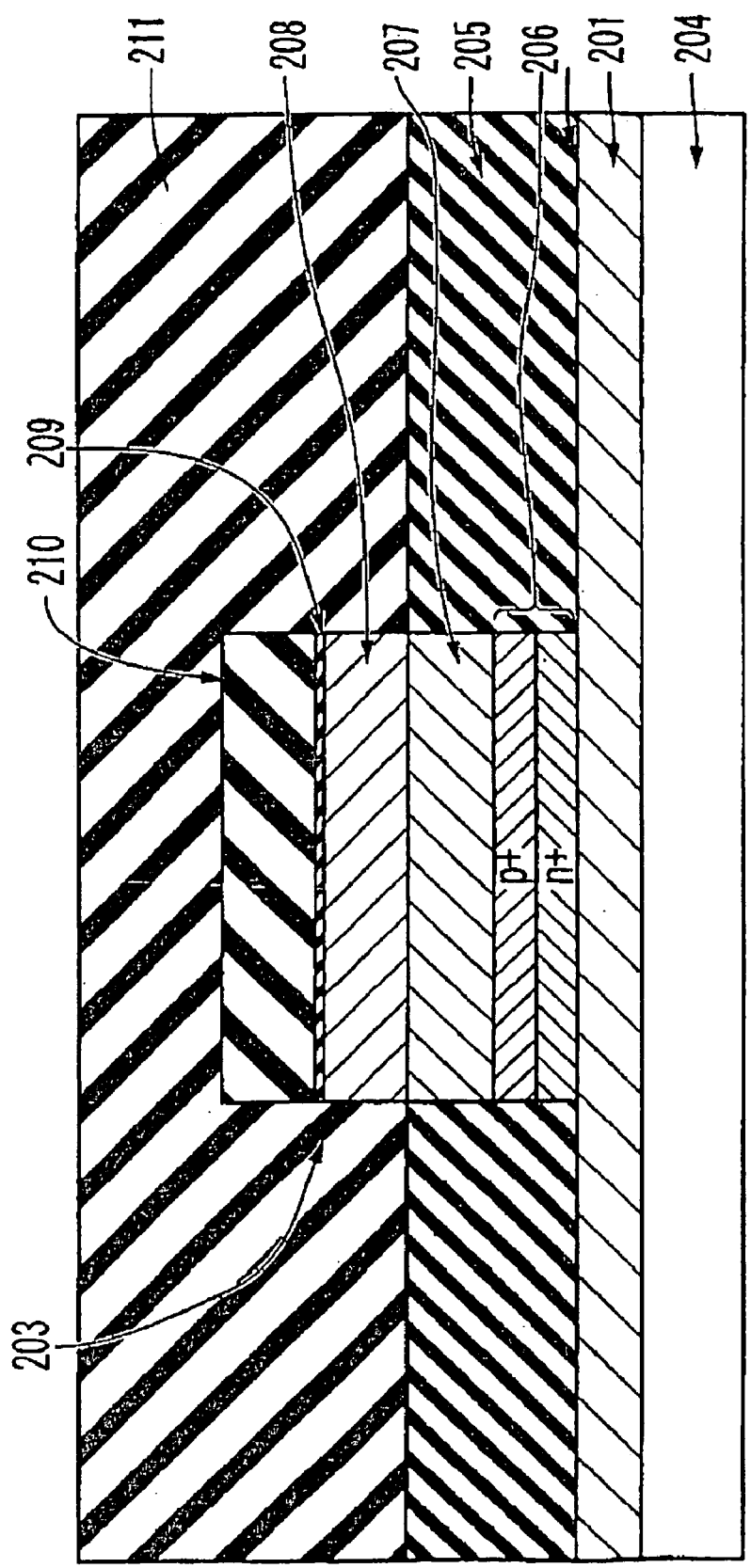
FIG. 2 is a cross sectional view showing the conventional MRAM.
Figure 3:
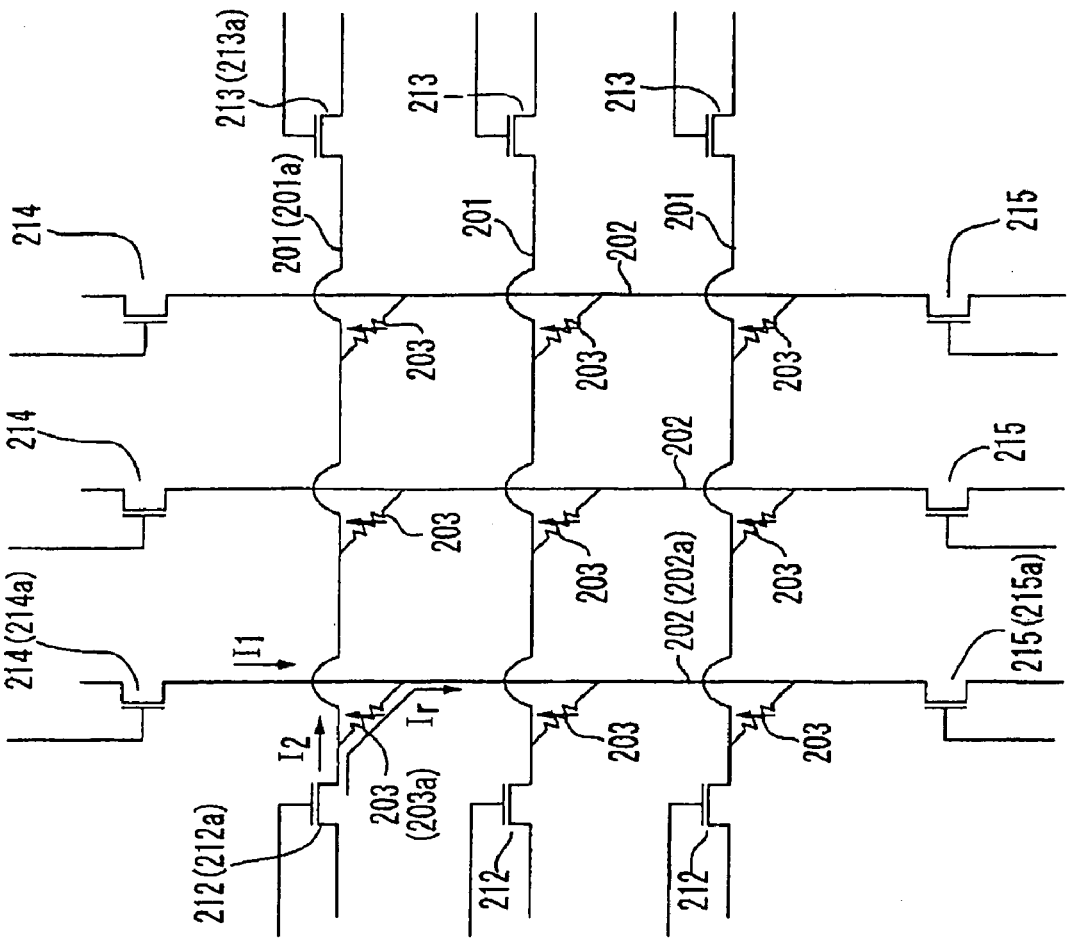
FIG. 3 shows an equivalent circuit of the conventional MRAM.

According to the MRAM in the seventh embodiment which operates as described above, it is possible to reduce the area of peripheral circuit used for the data reading operation and writing operation as compared with the conventional MRAM. In reference to the conventional MRAM shown in FIG. 3, a large write current $I_2$ flows through any of the row selector transistors 212, 213 in the conventional MRAM. It is therefore necessary to use a MOS transistor with a large gate width as the row selector transistors 212, 213. On the other hand, according to the seventh embodiment, a relatively small read current $I_r$ flows through the read row selector transistor 82, and a large write current $I_2$ does not flow. It is therefore possible to use a MOS transistor having a relatively small gate width and hence a small area as the read row selector transistor 82. Thus, it is possible according to the MRAM in the seventh embodiment to reduce the area of the peripheral circuit as compared with the conventional MRAM.

According to the seventh embodiment as described above, the smoothness of the tunnel current passage section of the tunnel insulating film 93 through which the tunnel current flows is improved, and the occurrence of the defects in the tunnel current passage section is prevented. Thus, the occurrence of failure bits in the MRAM is suppressed.

Moreover, according to the seventh embodiment, the tungsten plug electrically connecting the lower magnetic layer 91 with the bit line 85 is eliminated. Since the tungsten plug electrically connecting the lower magnetic layer 91 with the bit line 85 is eliminated, the memory cells can be distributed densely and hence the memory cell area can be miniaturized.

Furthermore, it is possible according to the seventh embodiment to use a MOS transistor with a small gate width as the read row selector transistor 82 and to reduce the area of the peripheral circuit used for the data reading operation and writing operation.

Eighth Embodiment

Figure 27:
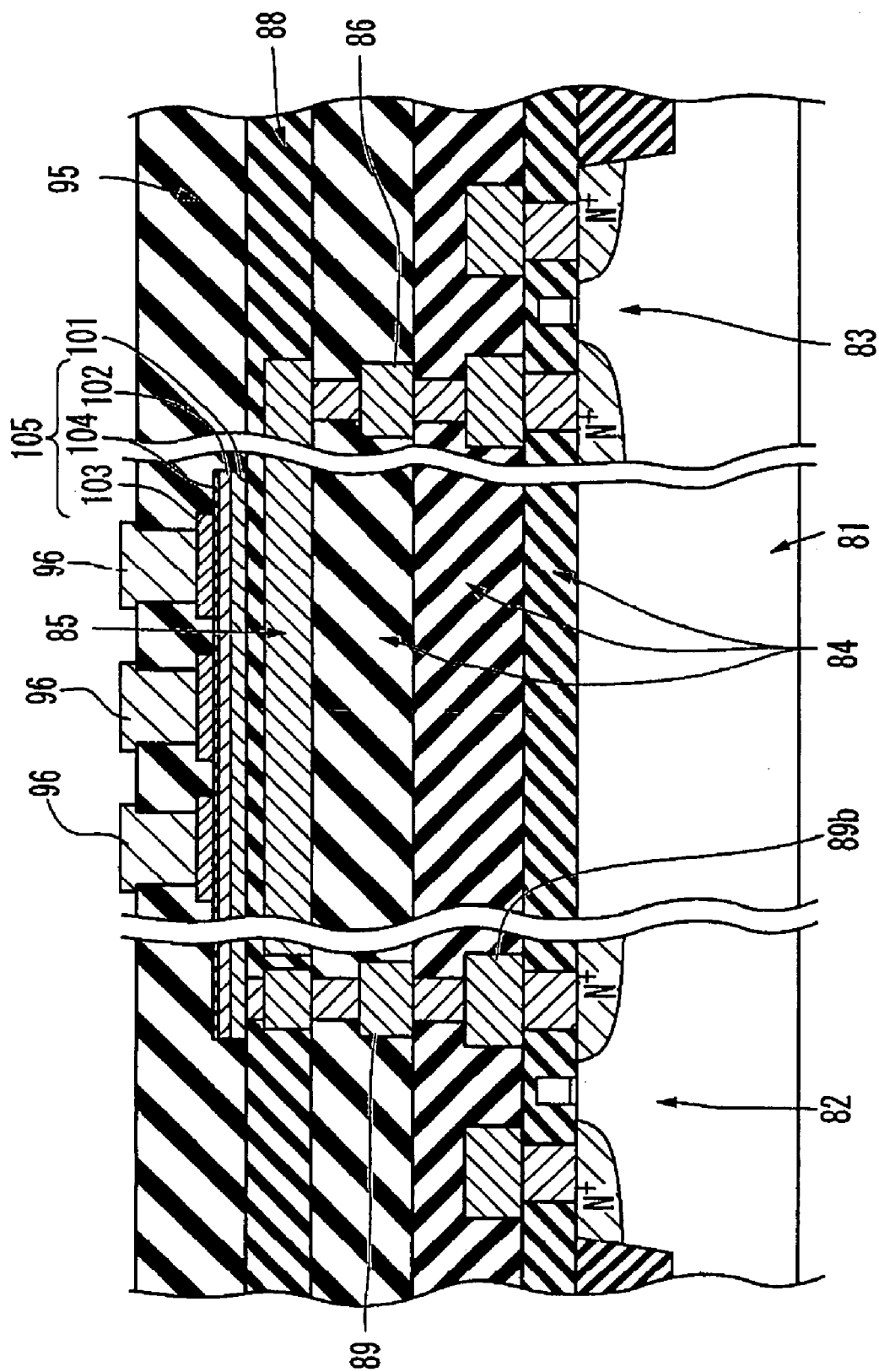
FIG. 27 is a cross sectional view showing an eighth embodiment of an MRAM according to the present invention.

FIG. 27 shows an eighth embodiment of an MRAM according to the present invention. The MRAM in the eighth embodiment is almost similar in structure to the seventh embodiment. The MRAM according to the eighth embodiment differs from the MRAM according to the seventh embodiment in that a lower electrode layer 101 is formed under a lower magnetic layer 102 of a memory cell 105 and the electrical connection between the memory cell 105 and the stacked via 89 is achieved through the lower electrode layer 101. The MRAM in the eighth embodiment will be described in detail hereinafter.

As is the case with the seventh embodiment, the MRAM in the eighth embodiment has the substrate 81 on whose surface the read row selector transistor 82 and the write row selector transistor 83 are formed. The substrate 81 is covered by the laminated interlayer insulating film 84. The bit line 85 is formed on the top layer of the interlayer insulating film 84. The bit line 85 is electrically connected to the source/drain of the write row selector transistor 83 through the stacked via 86. The bit line 85 is covered by the interlayer insulating film 88. The interlayer insulating film 88 is planarized to be flat by the CMP.

The lower electrode layer 101 is formed on the interlayer insulating film 88. As is the case with the lower electrode layer 25 in the second embodiment shown in FIG. 11, the lower electrode layer 101 is constituted of a first tantalum film, an aluminum film and a second tantalum film, which are deposited from the side of the substrate 81 in order.

The lower magnetic layer 102 is formed on the lower electrode layer 101. As is the case with the lower magnetic layer 22 in the second embodiment shown in FIG. 11, the lower magnetic layer 102 is constituted of an initial magnetic layer made of permalloy (Ni—Fe), an antiferromagnetic layer made of Ir—Mn and a pinned ferromagnetic layer made of Co—Fe, which are deposited from the side of the substrate 1 in order. The typical thicknesses of the initial magnetic layer, the antiferromagnetic layer and the pinned ferromagnetic layer are 2 nm, 10 nm and 3 nm, respectively. The pinned ferromagnetic layer is made of a ferromagnetic material and has a spontaneous magnetization. The spontaneous magnetization of the pinned ferromagnetic layer is fixed due to the interaction from the antiferromagnetic layer.

The lower magnetic layer 102 is electrically connected to the source/drain of the read row selector transistor 82 through the stacked via 89. The stacked via 89 includes tungsten plugs 89a and lands 89b which are alternately laminated.

On the lower magnetic layer 102, a tunnel insulating layer 104 made of alumina ($Al_2O_3$) is formed. The thickness of the tunnel insulating layer 104 is thin to the extent that a tunnel current flows therethrough, and is typically 1 to 3 nm.

An upper ferromagnetic layer 103 is formed on the tunnel insulating layer 104. As is the case with the upper magnetic layer 23 in the second embodiment shown in FIG. 11, the upper magnetic layer 103 is constituted of a free ferromagnetic layer made of Ni—Fe, a first tantalum layer, an aluminum layer and a second tantalum layer, which are deposited from the side of the substrate 1 in order. The typical thicknesses of the free ferromagnetic layer, the first tantalum layer, the aluminum layer and the second tantalum layer are 5 nm, 5 nm, 20 nm and 5 nm, respectively. The free ferromagnetic layer is made of ferromagnetic material and has a spontaneous magnetization. The free ferromagnetic layer is formed such that its spontaneous magnetization is reversible.

The lower magnetic layer 102, the upper magnetic layer 103 and the tunnel insulating layer 104 provide the memory cell 105.

Figure 28:
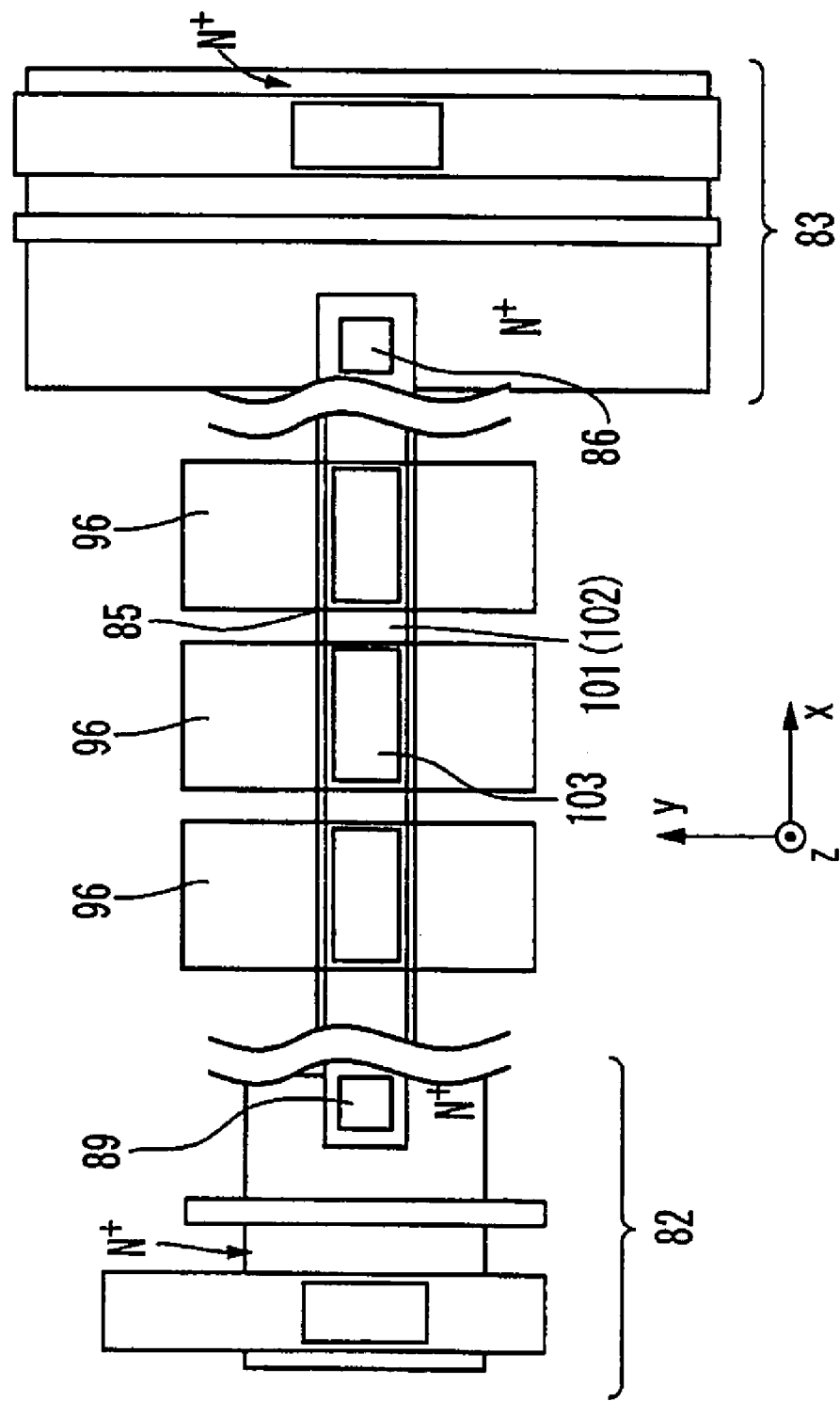
FIG. 28 is a plan view showing the eighth embodiment of the MRAM according to the present invention.

The memory cell 105 is covered by the interlayer insulating film 95. The word line 96 is formed on the interlayer insulating film 95. The word line 96 is electrically connected to the upper magnetic layer 103 of the memory cell 105 through a contact hole provided for the interlayer insulating film 95. As shown in FIG. 28, the word line 96 is formed to extend in the y-axis direction which is substantially perpendicular to the x-axis direction in which the bit line 85 extends.

As shown in FIG. 27, the whole of the upper magnetic layer 103 is formed above the planarized interlayer insulating film 88. Thus, the smoothness of a tunnel current passage section of the tunnel insulating layer 104 through which the tunnel current flows is improved, and the occurrence of the defects in the tunnel current passage section is prevented. Thus, the occurrence of failure bits in the MRAM is suppressed according to the seventh embodiment.

The writing operation and the reading operation in the MRAM according to the eighth embodiment are the same as those in the MRAM according to the seventh embodiment except that the lower electrode layer 101 and the lower magnetic layer 102 are used instead of the lower magnetic layer (read bit line) 91 in the MRAM according to the seventh embodiment shown in FIG. 26. According to the MRAM in the eighth embodiment as is the case with the MRAM in the seventh embodiment, it is possible to use a MOS transistor with a small gate width as the read row selector transistor 82 and to reduce the area of the peripheral circuit used for the data reading operation and writing operation.

According to the eighth embodiment as is the case with the seventh embodiment, the smoothness of the tunnel current passage section of the tunnel insulating layer 104 through which the tunnel current flows is improved, and the occurrence of the defects in the tunnel current passage section is prevented. Also, since the tungsten plug electrically connecting the lower magnetic layer 91 with the bit line 85 is eliminated, it becomes possible to distribute the memory cells 94 densely. Moreover, it is possible to use a MOS transistor with a small gate width as the read row selector transistor 82 and to reduce the area of the peripheral circuit used for the data reading operation and writing operation.

Furthermore, according to the eighth embodiment, the lower electrode layer 101 having lower resistance than the lower magnetic layer 102 is formed under the lower magnetic layer 102, which reduces the electric resistance of the path through which the read current flows. Thus, the SN ratio at the time of the data reading is increased.

Ninth Embodiment

Figure 29:
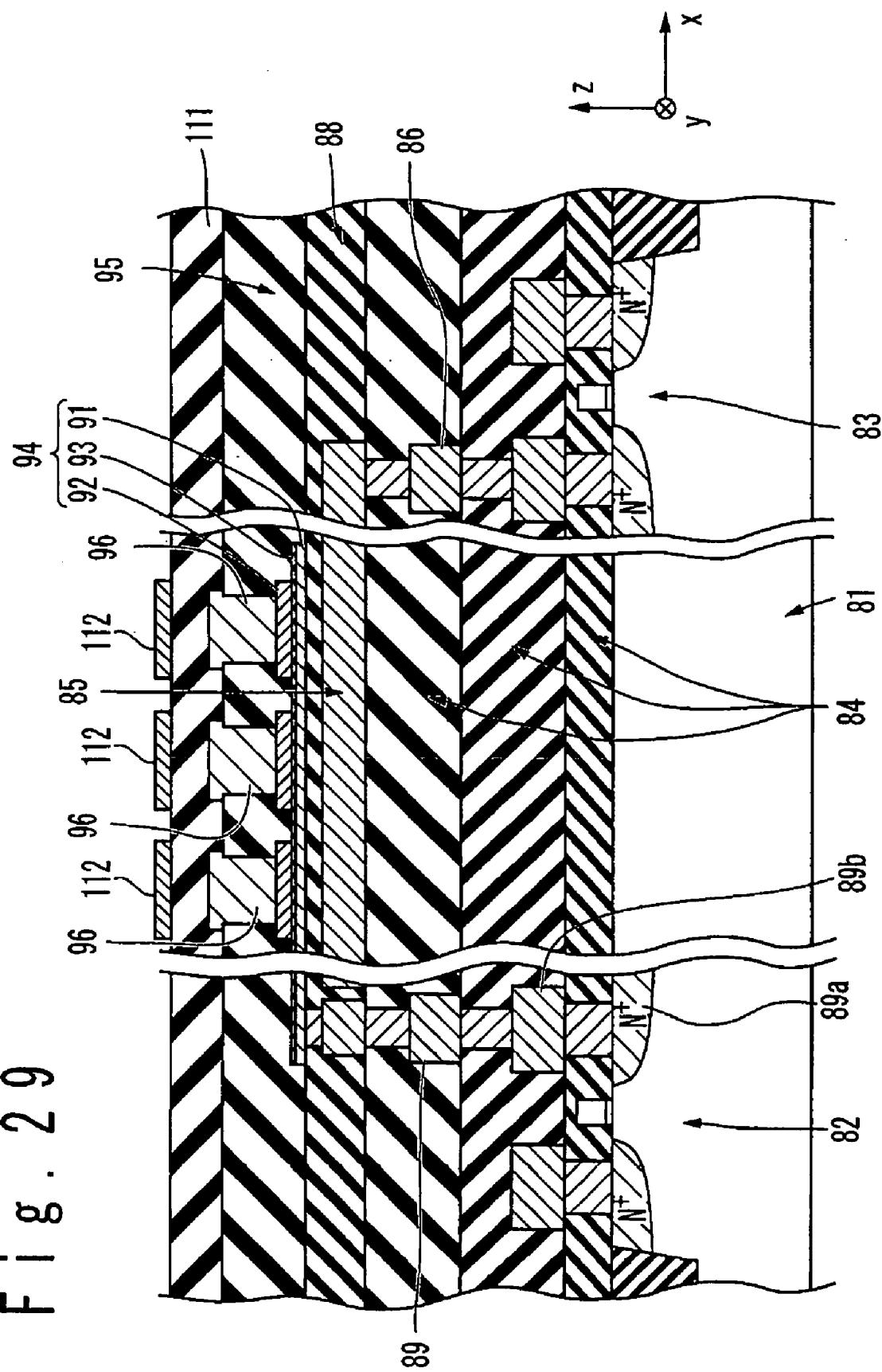
FIG. 29 is a cross sectional view showing a ninth embodiment of an MRAM according to the present invention.

FIG. 29 shows a ninth embodiment of an MRAM according to the present invention. The MRAM according to the ninth embodiment is almost similar in structure to the seventh embodiment. According to the ninth embodiment as is the case with the seventh embodiment, the smoothness of the tunnel current passage section of the tunnel insulating film 93 through which the tunnel current flows is improved, and the occurrence of the defects in the tunnel current passage section is prevented. Furthermore, the tungsten plug electrically connecting the lower magnetic layer 91 with the bit line 85 is eliminated, which makes it possible to achieve the miniaturization of the memory cell area.

Figure 30:
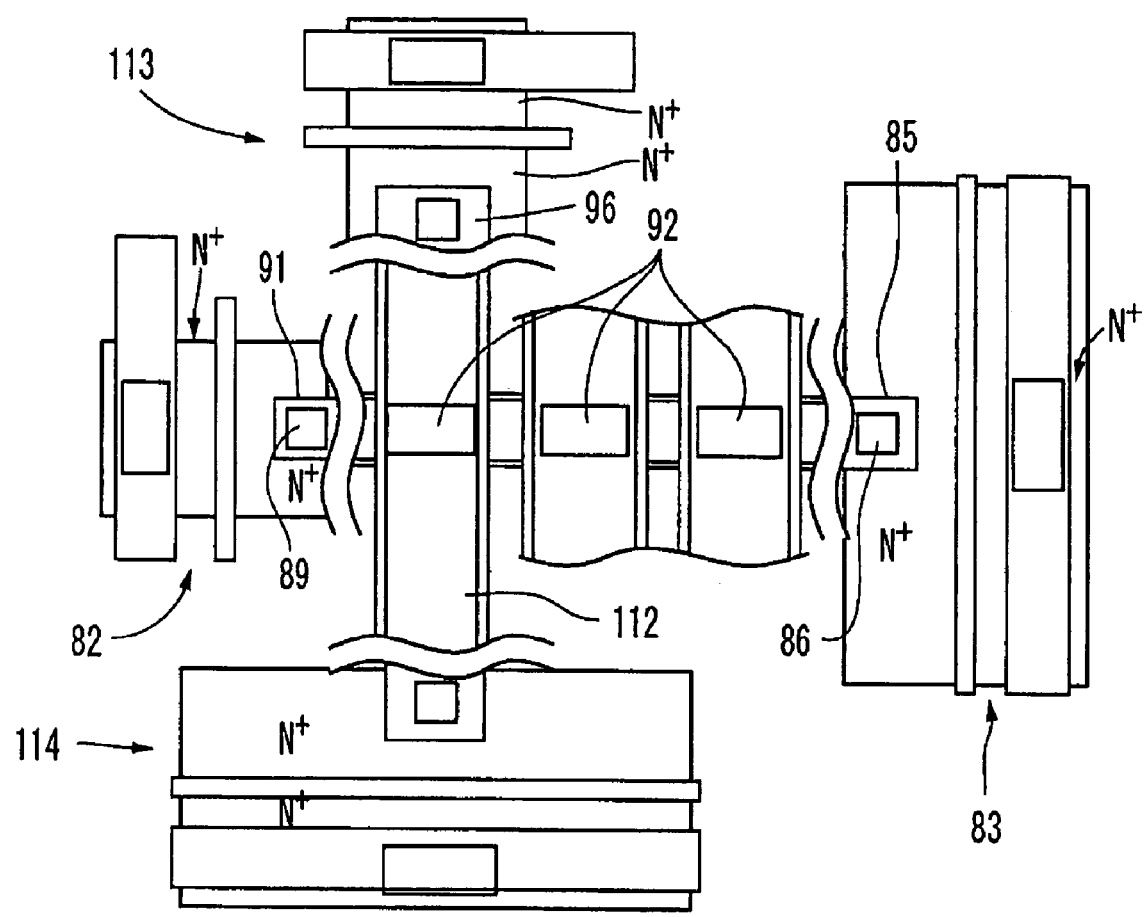
FIG. 30 is a plan view showing the ninth embodiment of the MRAM according to the present invention.

According to the ninth embodiment, a write word line 112 used only in the writing operation is added to the MRAM of the seventh embodiment in order to further reduce the area of the peripheral circuit. The interlayer insulating film 95 and the word line 96 are covered by an interlayer insulating film 111, and the write word line 112 is formed on the interlayer insulating film 111. The word line 96 is used only in the reading operation. To be clearly distinguished from the write word line 112, the word line 96 is hereinafter referred to as a read word line 96. As shown in FIG. 30, the read word line 96 is connected to a read column selector transistor 113, and the write word line 112 is connected to a write column selector transistor 114. The gate width of the read column selector transistor 113 is narrower than the gate width of the write column selector transistor 114. Therefore, the area of the read column selector transistor 113 is smaller than the area of the write column selector transistor 114.

Figure 31:
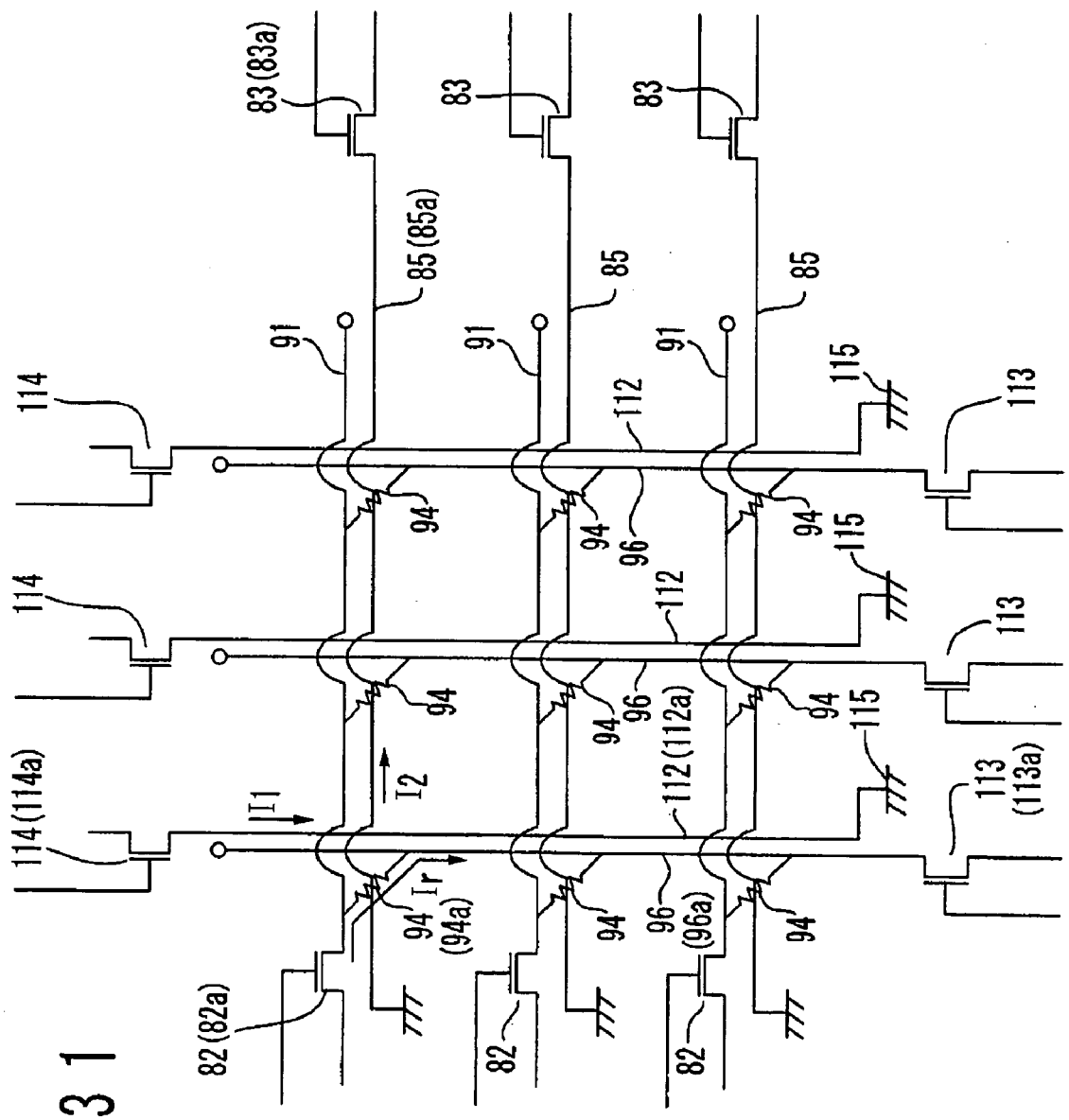
FIG. 31 is a figure showing an equivalent circuit of the MRAM according to the ninth embodiment.

FIG. 31 shows an equivalent circuit of the MRAM according to the ninth embodiment. The write bit line 85 and the read bit line (lower magnetic layer) 91 are formed to extend in the x-axis direction and cross the read word line 96 and write word line 112 extending in the y-axis direction. The memory cells 94 are provided where they cross. It should be noted that the memory cell 94 is provided to electrically bridge the read bit line 91 and the read word line 96, and is electrically isolated from the write bit line 85 and the write word line 112.

One end of the read word line 96 is connected to the read column selector transistor 113, and the other end is open. One end of the write word line 112 is connected to the write column selector transistor 114, and the other end is connected to a terminal 115 having a predetermined potential (typically, ground potential). The read word line 96 and the write word line 112 are isolated from each other and are not electrically connected.

According to the ninth embodiment, the data writing to the memory cell 94 is carried out by using the write bit line 85 and the write word line 112. The read bit line 91 and the read word line 96 are not used. More specifically, in the case when a data is written to a memory cell 94a of the memory cells 94, for example, a write word line 112a and a write bit line 85a which cross near the memory cell 94a are first selected. A write column selector transistor 114a connected with the selected write word line 112a is activated, and a write current $I_1$ is supplied to the write word line 112a. Further, a write selector transistor 83a connected with the selected write bit line 85a is activated, and a write current $I_2$ is supplied to the write bit line 85a. The write currents $I_1$, $I_2$ are typically in a range from a few mA to a few tens of mA. Due to magnetic fields generated by the write current $I_1$ and the write current $I_2$, the data is written to the memory cell 94.

On the other hand, the reading of data from the memory cell 94 is carried out by using the read bit line 91 and the read word line 96. The write bit line 85 and the write word line 112 are not used. For example, in the case when data is read out from the above-mentioned memory cell 94a, the word line 96a and a read bit line (lower magnetic layer) 91a which cross the memory cell 94a are first selected. Next, the column selector transistor 113a connected to one end of the word line 96a is activated, and further the read row selector transistor 82 connected to the read bit line 91a is activated. Next, a voltage is applied between the word line 96a and the read bit line 91a, and the read current $I_r$ flows through the memory cell 94a. The read current $I_r$ is typically a few μA. Based on the read current $I_r$, the data stored in the memory cell 94a is identified.

As is the case with the MRAM according to the seventh embodiment, in the MRAM according to the ninth embodiment which operates as described above, it is possible to use a comparatively small gate width as the read row selector transistor 82 and to reduce the area of the peripheral circuit.

Moreover, it is possible according to the MRAM in the ninth embodiment to use a MOS transistor with a small gate width as the read column selector transistor 113 and to further reduce the area of the peripheral circuit. In reference to the MRAM according to the seventh embodiment shown in FIG. 26, a large write current $I_1$ flows through any of the column selector transistors 97, 98 in the MRAM according to the seventh embodiment. It is therefore necessary to use a MOS transistor with a large gate width as the column selector transistors 97, 98. On the other hand, according to the ninth embodiment, a relatively small read current $I_r$ flows through the read column selector transistor 113, and a large write current $I_1$ does not flow. It is therefore possible to use a MOS transistor having a relatively small gate width and hence a small area as the read column selector transistor 113. Thus, it is possible according to the MRAM in the ninth embodiment to further reduce the area of the peripheral circuit as compared with the MRAM according to the seventh embodiment.

Figure 32:
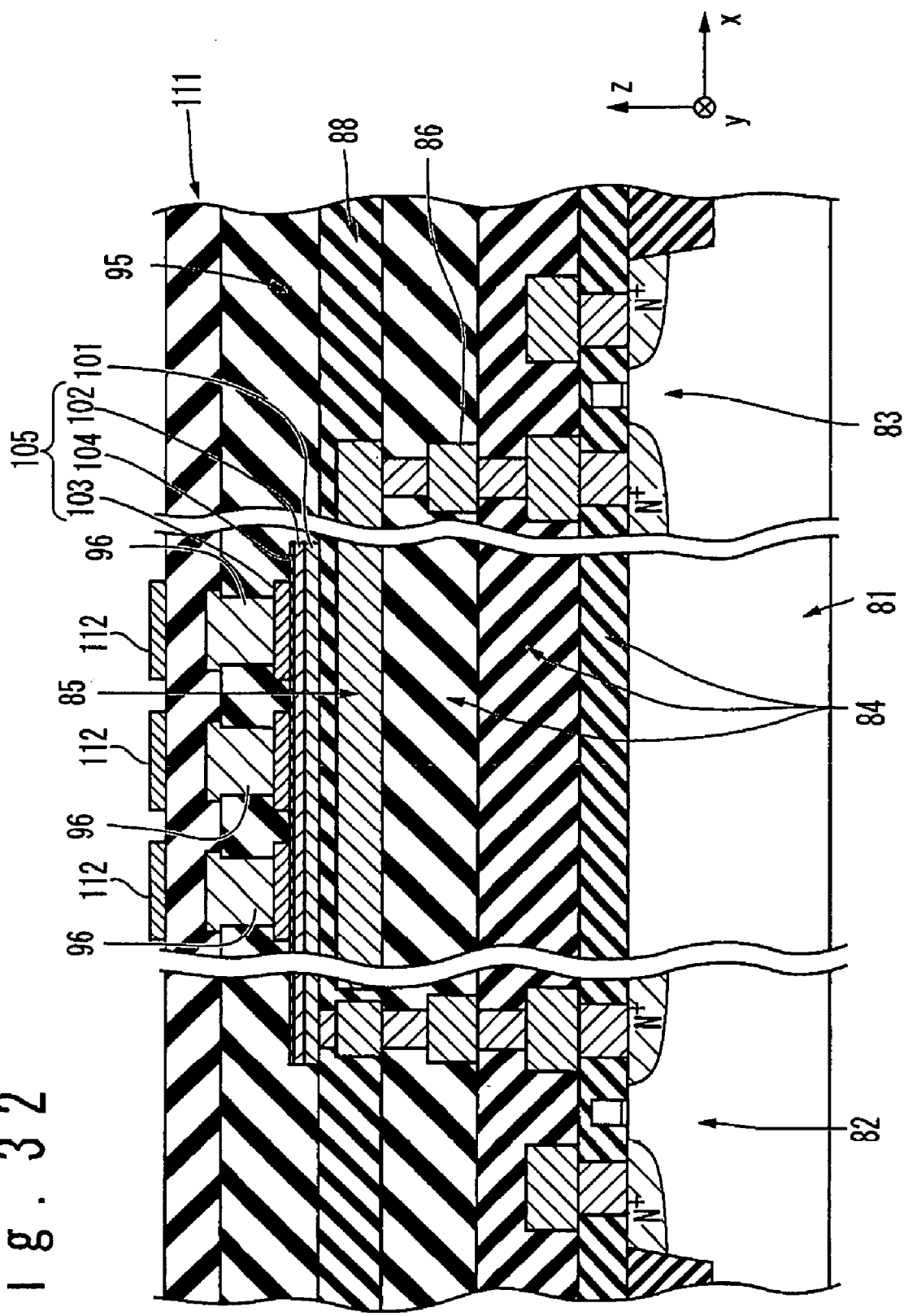
FIG. 32 is a figure showing a modification of the MRAM according to the ninth embodiment.

It should be noted that, as shown in FIG. 32, the write word line 112 (and the interlayer insulating film 111) can be added to the MRAM according to the eighth embodiment (refer to FIG. 27). By adding the write word line 112 and by operating in the same way as the above-mentioned MRAM according to the ninth embodiment, it is possible to further reduce the area of the peripheral circuit.

Tenth Embodiment

Figure 33:
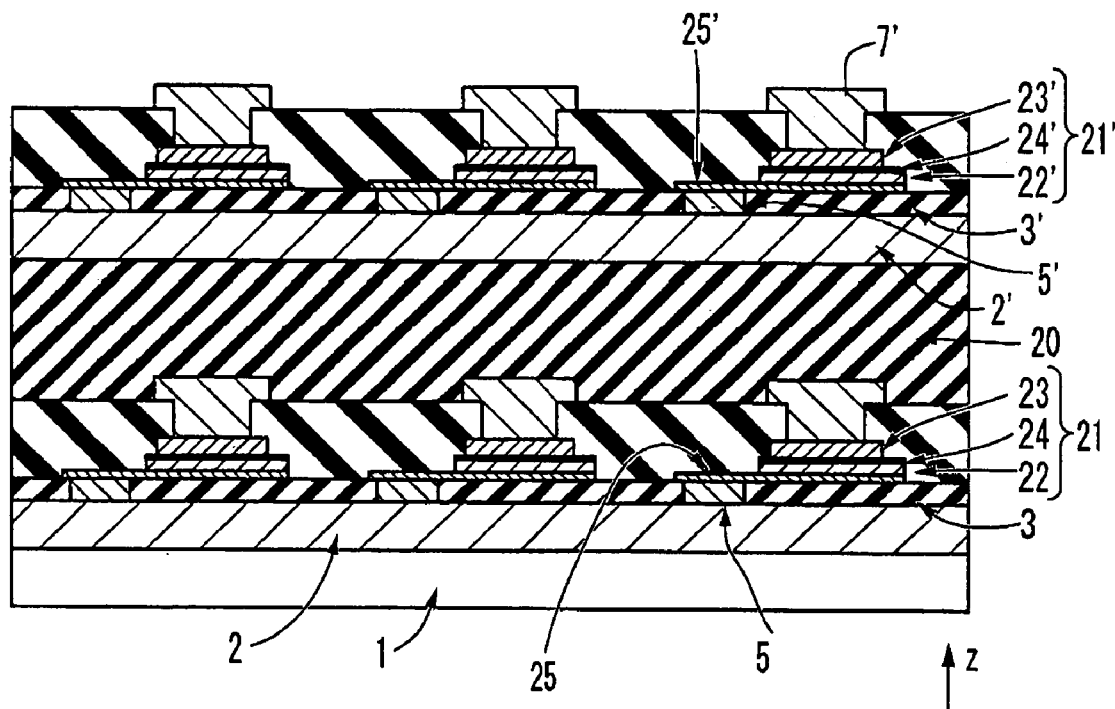
FIG. 33 is a cross sectional view showing an MRAM according to a tenth embodiment.

FIG. 33 shows a tenth embodiment of an MRAM according to the present invention. According to the tenth embodiment, memory cell arrays are stacked in a vertical direction with respect to the substrate, and hence the memory cell is further highly integrated.

According to the MRAM in the tenth embodiment, formed on the top surface of the substrate 1 are the bit line 2, the interlayer insulating film 3, the lower electrode 25, the memory cell 21, the interlayer insulating film 6 and the word line 7. The structures of the bit line 2, the interlayer insulating film 3, the lower electrode 25, the memory cell 21, the interlayer insulating film 6 and the word line 7 are the same as those in the MRAM according to the second embodiment (refer to FIG. 9). As described in the second embodiment, the whole of the tunnel current passage section 24a determining the property of the memory cell 21 is arranged not to overlap with the tungsten plug 5 on whose surface concavities and convexities tend to appear. Therefore, defects are hardly generated in the tunnel current passage section 24a. The bit line 2, the interlayer insulating film 3, the lower electrode 25, the memory cell 21, the interlayer insulating film 6 and the word line 7 provide a memory cell array unit α.

Figure 34:
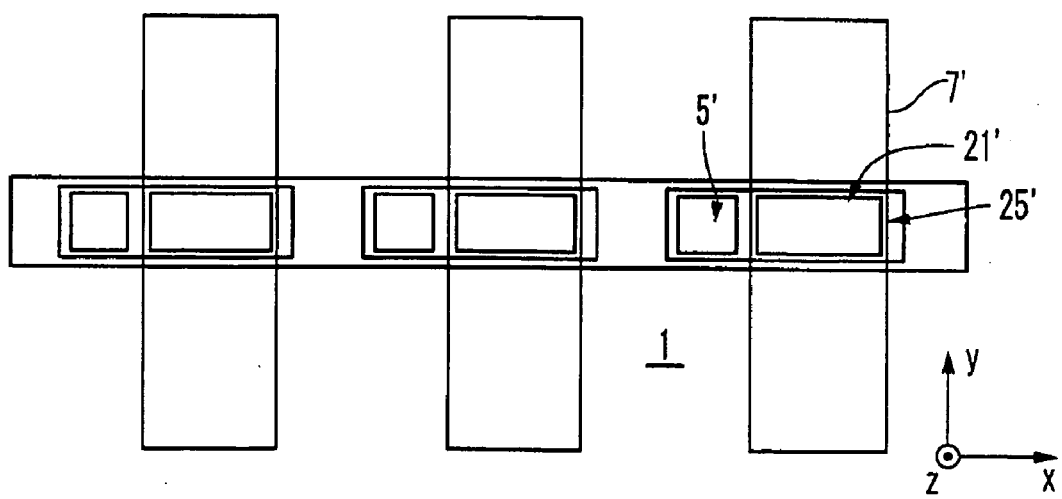
FIG. 34 is a plan view showing the MRAM according to the tenth embodiment.

According to the tenth embodiment, this memory cell array unit α is covered by an interlayer insulating film 20, and a memory cell array unit β with the same structure as the memory cell array unit α is formed on the interlayer insulating film 20. The memory cell array unit β is configured to include a bit line 2', an interlayer insulating film 3', a lower electrode 25', a memory cell 21', an interlayer insulating film 6' and a word line 7'. As shown in FIG. 33 and FIG. 34, the structures of the bit line 2', the interlayer insulating film 3', the lower electrode 25', the memory cell 21', the interlayer insulating film 6' and the word line 7' are the same as the structures of the bit line 2, the interlayer insulating film 3, the lower electrode 25, the memory cell 21, the interlayer insulating film 6 and the word line 7 of the memory cell array unit α, respectively.

Since the memory cell array unit α and the memory cell array unit β are stacked, the integration density of the magnetic random access memory becomes twice and the high-integration of the memory is achieved. It is possible to further stack another memory cell array unit having the same structure as the memory cell array unit α on the top surface of the memory cell array unit β. Further stacking of the memory cell array unit achieves further integration of the memory.

As described above, in the tenth embodiment, the smoothness of a tunnel current passage section of the tunnel insulating layer 24 through which the tunnel current flows is improved, and the occurrence of the defects in the tunnel current passage section is prevented. Thus, the occurrence of failure bits is suppressed in the MRAM according to the tenth embodiment.

Furthermore, according to the tenth embodiment, the memory cell array units in which memory cells 21 are formed are stacked in the vertical direction with respect to the substrate 1, and the high-integration of the memory is achieved.

It should be noted that the stacking of the memory cells in the vertical direction with respect to the substrate is possible in any of the MRAMs from the first to the ninth embodiments.

The invention claimed is:

1. A magnetic random access memory comprising:
a substrate;
an interlayer insulating film covering said substrate;
a memory cell; and
a plug penetrating said interlayer insulating film,
wherein said memory cell includes:
a first magnetic layer formed above said interlayer insulating film;
a tunnel insulating layer formed on said first magnetic layer; and
a second magnetic layer formed on said tunnel insulating layer,
said plug is directly and electrically connected to said first magnetic layer,
at least a part of a tunnel current passage section of said tunnel insulating layer which is located between said first magnetic layer and said second magnetic layer does not overlap with said plug in a vertical direction which is vertical to a surface of said substrate.

2. The magnetic random access memory according to claim 1, wherein whole of said tunnel current passage section does not overlap with said plug.

3. The magnetic random access memory according to claim 1, wherein a surface of said interlayer insulating film is planarized to be flat.

4. A magnetic random access memory comprising:
a substrate;
an interlayer insulating film covering said substrate;
a memory cell;
a lower electrode; and
a plug penetrating said interlayer insulating film,
wherein said memory cell includes:
a first magnetic layer formed above said interlayer insulating film;
a tunnel insulating layer formed on said first magnetic layer; and
a second magnetic layer formed on said tunnel insulating layer,
at least a part of a tunnel current passage section of said tunnel insulating layer which is located between said first magnetic layer and said second magnetic layer does not overlap with said plug in a vertical direction which is vertical to a surface of said substrate,
wherein said lower electrode is provided between said interlayer insulating film and said first magnetic layer and has a lower resistance than that of said first magnetic layer, and
wherein said first magnetic layer is electrically connected to said plug through said lower electrode.

5. The magnetic random access memory according to claim 1, wherein said plug includes a metal section made of a metal.

6. The magnetic random access memory according to claim 5, wherein said metal is tungsten.

7. The magnetic random access memory according to claim 1, wherein a tunnel current flows between a plurality of the second magnetic layers and one first magnetic layer of said first magnetic layer.

8. The magnetic random access memory according to claim 7, wherein a number of the plugs connected with said one first magnetic layer is smaller than a number of the second magnetic layers.

9. A magnetic random access memory comprising:
a substrate;
a first interconnection formed on said substrate and extending in a predetermined first direction;
an interlayer insulating film covering said first interconnection;
a memory cell formed above said interlayer insulating film, said memory cell including a first magnetic layer having a pinned spontaneous magnetization which is fixed, a second magnetic layer having a free spontaneous magnetization which is reversible according to a stored data and a tunnel insulating layer provided between said first magnetic layer and said second magnetic layer;
a first current applying section which supplies to said first interconnection a first current for generating a first magnetic field applied to said memory cell when rewriting said stored data; and
a voltage applying section which applies a voltage between said first magnetic layer and said second magnetic layer when reading said stored data,
wherein said first interconnection is electrically isolated from said memory cell.

10. The magnetic random access memory according to claim 9,
wherein one of said first magnetic layer and said second magnetic layer is formed to extend in the first direction,
said magnetic random access memory further comprises a plug which electrically connects said voltage applying section with said memory cell and penetrates said interlayer insulating film to be connected to said one,
at least a part of a tunnel current passage section of said tunnel insulating layer which is located between said first magnetic layer and said second magnetic layer does not overlap with said plug in a vertical direction which is vertical to a surface of said substrate.

11. The magnetic random access memory according to claim 9, further comprising:
a second interconnection which is electrically connected to one of said first magnetic layer and said second magnetic layer and is formed to extend in a second direction which is substantially perpendicular to said first interconnection;
a third interconnection which is formed to extend in said second direction and is electrically isolated from said second interconnection; and
a second current applying section which supplies to said third interconnection a second current for generating a second magnetic field applied to said second magnetic layer when rewriting said stored data, wherein said voltage applying section applies said voltage between said first magnetic layer and said second magnetic layer through said second interconnection.

12. A magnetic random access memory comprising:

a substrate;

a memory cell formed above said substrate, said memory cell including a first magnetic layer having a pinned spontaneous magnetization which is fixed, a second magnetic layer having a free spontaneous magnetization which is reversible according to a stored data and a tunnel insulating layer provided between said first magnetic layer and said second magnetic layer;

a second interconnection which is electrically connected to one of said first magnetic layer and said second magnetic layer and is formed to extend in a predetermined second direction;

a third interconnection which is formed to extend in the second direction and is electrically isolated from said second interconnection;

a second current applying section which supplies to said third interconnection a second current for generating a second magnetic field applied to said second magnetic layer when rewriting said stored data; and a voltage applying section which applies a voltage between said first magnetic layer and said second magnetic layer through said second interconnection when reading said stored data.

13. The magnetic random access memory according to claim 1, wherein said memory cell is plural and is arranged in a direction vertical to a surface of said substrate.

14. The magnetic random access memory according to claim 9, wherein said memory cell is plural and is arranged in a direction vertical to a surface of said substrate.

15. The magnetic random access memory according to claim 12, wherein said memory cell is plural and is arranged in a direction vertical to a surface of said substrate.

16. A method of operating a magnetic random access memory, which includes: a first magnetic layer having a pinned spontaneous magnetization which is fixed; a second magnetic layer having a free spontaneous magnetization which is reversible according to a stored data; a tunnel insulating layer provided between said first magnetic layer and said second magnetic layer; and a first interconnection electrically isolated from both of said first magnetic layer and said second magnetic layer, said method comprising the steps of:

generating a magnetic field by supplying a current to said first interconnection, and reversing said free spontaneous magnetization by said magnetic field;

applying a voltage between said first magnetic layer and said second magnetic layer without said first interconnection; and detecting a tunnel current which flows through said tunnel insulating layer due to said voltage, and determining said stored data based on said tunnel current.

17. A method of operating a magnetic random access memory, which includes: a first magnetic layer having a pinned spontaneous magnetization which is fixed; a second magnetic layer having a free spontaneous magnetization which is reversible according to a stored data; a tunnel insulating layer provided between said first magnetic layer and said second magnetic layer; a first interconnection electrically isolated from both of said first magnetic layer and said second magnetic layer; and a second interconnection which is electrically isolated from both of said first magnetic layer and said second magnetic layer and is formed to extend in a direction substantially perpendicular to the direction in which said first interconnection extends, said method comprising the steps of:

generating a magnetic field by supplying a first current to said first interconnection and a second current to said second interconnection, and reversing said free spontaneous magnetization by said magnetic field;

applying a voltage between said first magnetic layer and said second magnetic layer without said first interconnection and said second interconnection; and detecting a tunnel current which flows through said tunnel insulating layer due to said voltage; and determining said stored data based on said tunnel current.

* * * * *